(12) United States Patent
Nebashi et al.

(10) Patent No.: US 8,284,595 B2
(45) Date of Patent: Oct. 9, 2012

(54) MAGNETIC RANDOM ACCESS MEMORY AND OPERATING METHOD OF THE SAME

(75) Inventors: Ryusuke Nebashi, Tokyo (JP); Noboru Sakimura, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 339 days.

(21) Appl. No.: 12/741,299

(22) PCT Filed: Oct. 30, 2008

(86) PCT No.: PCT/JP2008/069770
§ 371 (c)(1),
(2), (4) Date: May 4, 2010

(87) PCT Pub. No.: WO2009/060783
PCT Pub. Date: May 14, 2009

(65) Prior Publication Data
US 2010/0238719 A1    Sep. 23, 2010

(30) Foreign Application Priority Data

Nov. 8, 2007  (JP) ................................. 2007-290681

(51) Int. Cl.
*G11C 11/00* (2006.01)
(52) U.S. Cl. .................. 365/158; 365/171; 365/173
(58) Field of Classification Search .................. 365/158, 365/171, 173, 148
See application file for complete search history.

(56) References Cited

U.S. PATENT DOCUMENTS 7,072,236 B2 *  7/2006  Matsuoka ..................... 365/207
2009/0116309 A1 *  5/2009  Hanzawa et al. ........ 365/189.15

FOREIGN PATENT DOCUMENTS

| JP | 2002-008369 A | 1/2002 |
| JP | 2004-523055 A | 7/2004 |
| JP | 2004-348934 A | 12/2004 |

OTHER PUBLICATIONS

International Search Report for PCT/JP2008/069770, mailed Dec. 2, 2008.

* cited by examiner

*Primary Examiner* — VanThu Nguyen
*Assistant Examiner* — Hien Nguyen

(57) ABSTRACT

A MRAM includes: first and second bit lines provided to extend in a first direction; a storage block including at least one magnetoresistive element for storing data; and a reading circuit. The reading circuit includes a first terminal electrically connected to the first bit line, and a second terminal electrically connected to the second bit line. The second terminal has a high impedance preventing a steady-state current from flowing into at a time of a reading operation. The reading circuit supplies a reading current from the first terminal to the first bit line at the time of the reading operation. The storage block is configured such that the reading current flows from the first bit line to the magnetoresistive element and the magnetoresistive element is connected to the second bit line at the time of the reading operation. The reading circuit controls the reading current on the basis of a voltage applied to the second terminal through the second bit line.

20 Claims, 31 Drawing Sheets

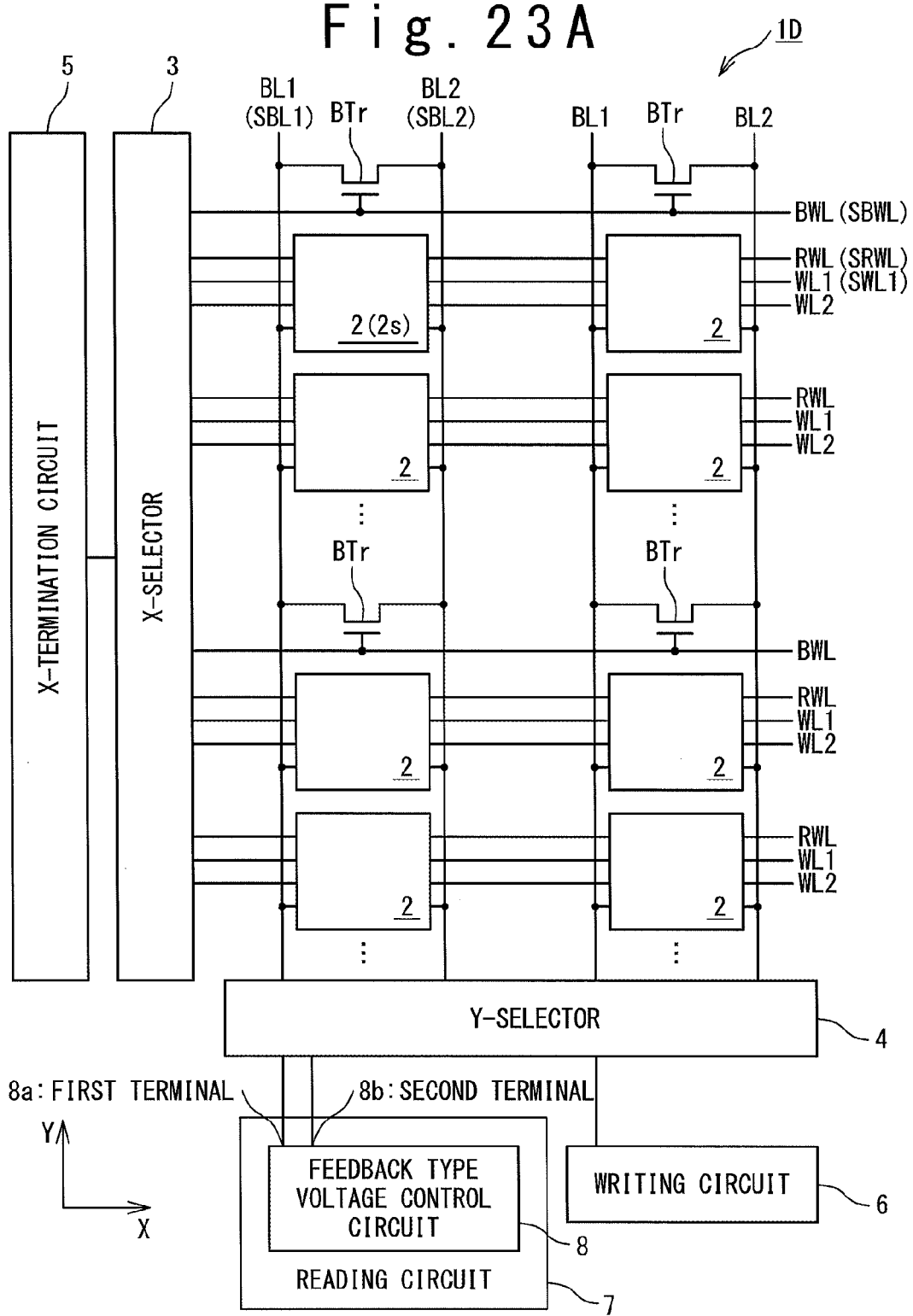

MAGNETIC RANDOM ACCESS MEMORY AND OPERATING METHOD OF THE SAME

TECHNICAL FIELD

The present invention relates to a magnetic random access memory (MRAM) and an operating method of the same.

BACKGROUND ART

A MRAM is a promising nonvolatile memory from the viewpoint of a high integration and a high speed operation. In the MRAM, a "Magnetoresistive element" showing a magnetoresistance effect such as a TMR (Tunnel MagnetoResistance) effect is used as a storage element. The magnetroresistive element includes two ferromagnetic layers and a nonmagnetic layer held between the two ferromagnetic layers. One of the two ferromagnetic layers is a magnetization pinned layer (pinned layer) whose magnetization orientation is fixed, and the other is a magnetization free layer (free layer) whose magnetization orientation can be inverted.

When the magnetization orientations of the magnetization pinned layer and the magnetization free layer are "anti-parallel", a resistance value (R+ΔR) of the magnetoresistive element is greater than a resistance value (R) when they are "parallel", due to the magnetoresistance effect. A memory cell of the MRAM uses the change in its resistance value and consequently stores data in a nonvolatile manner. For example, a high resistance state is correlated to "1", and a low resistance state is correlated to "0". The data of the memory cell can be read by detecting the resistance value of the magnetroresistive element. On the other hand, the data of the memory cell can be rewritten by inverting the magnetization orientation of the magnetization free layer.

FIG. 1 shows a part of a circuit configuration of a MRAM described in Japanese Patent Publication No. JP-P 2004-348934A. A plurality of writing word lines 103W and a plurality of reading word lines 103R are provided to extend in an X-axis direction and connected to an X-selector 108. Also, a plurality of first bit lines 104 and a plurality of second bit lines 105 are provided to extend in a Y-axis direction and connected to a Y-selector 111.

A memory cell array 110 includes a plurality of memory cells 120 arranged in an array shape. Each memory cell 120 includes a transistor 106 and a magnetoresistive element 107. A gate of the transistor 106 is connected to the writing word line 103W. One of the source/drain of the transistor 106 is connected to the first bit line 104, and the other is connected to the second bit line 105. One end of the magnetroresistive element 107 is connected to the reading word line 103R, and the other end is connected to the second bit line 105.

Some of the memory cells 120 are used to generate a reference current when data is read. The foregoing memory cell is hereinafter referred to as a reference cell 120r. Also, the first bit line 104 and the second bit line 105, which are connected to the reference cell 120r, are referred to as a first reference bit line 104r and a second reference bit line 105r, respectively. A current sense amplifier 115 is connected to the Y-selector 111 and the second reference bit line 105r.

The data reading from a certain memory cell 120 is carried out in the following procedure (hereinafter, the memory cell 120 from which the data is read is referred to as a "selected memory cell 120s"). The X-selector 108 selects one reading word line 103R connected to the selected memory cell 120s and applies a reading voltage to the reading word line 103R. The Y-selector 111 selects one second bit line 105 connected to the selected memory cell 120s. Based on a difference between a voltage of the current sense amplifier 115 and a voltage of the reading word line 103R, a detection current Is flows through the selected second bit line 105. The value of the detection current Is depends on the resistance state of the magnetroresistive element 107 in the selected memory cell 120s. Also, a reference current Ir flows through the second reference bit line 105r connected to the reference cell 120r.

The current sense amplifier 115 determines the data recorded in the selected memory cell 120s based on the detection current Is and the reference current Ir. For example, let us suppose that the data of the reference cell 120r is fixed to "0". In that case, if the detection current Is and the reference current Ir are approximately equal, the current sense amplifier 115 judges that the data of the selected memory cell 120s is "0". On the other hand, if the detection current Is is smaller than the reference current Ir, the current sense amplifier 115 judges that the data of the selected memory cell 120s is "1".

Here, the point to be noticed is an existence of a flowing current that does not pass through the selected memory cell 120s. The MRAM shown in FIG. 1 has a cross point array configuration in which the memory cells 120 are connected to each other through many parallel routes. When the data is read from the selected memory cell 120s, the current that does not pass through the selected memory cell 120s flows on the parallel routes. The current is hereinafter referred to as "wraparound current". This wraparound current has influence on the detection current Is flowing through the selected second bit line 105. That is, the wraparound current reduces the reliability of the data judgment with regard to the selected memory cell 120s. In order to increase the reliability of the read data, it is important to suppress the influence of the wraparound current.

Japanese Patent Publication No. JP-P 2002-8369A also describes a cross point cell array. According to the technique described in this literature, in order to increase the reliability of data to be read, when the data is read, a voltage Vs applied to the selected bit line and a voltage Vns applied to the non-selected bit line are made equal. However, it is actually difficult to make the voltage Vs and the voltage Vns perfectly equal.

One reason why it is difficult to make the voltage Vs and the voltage Vns perfectly equal lies in a voltage drop caused by a wiring resistance and a voltage drop between a drain and a source, on a route through which the read current flows. The influence of these voltage drops disables the voltage Vs and the voltage Vns to be sufficiently controlled by a current sense amplifier.

Japanese Patent Publication No. JP-P 2004-523055A discloses a technique whose object is to avoid the voltage drop caused by a reading current in a column multiplexer of a semiconductor memory device. In the technique described in this literature, although the voltage at the end of a bit line can be controlled, the influence of the voltage drop caused by the reading current in the bit line cannot be removed. This implies that the voltage, which is applied to a cell at a time of a reading operation, cannot be sufficiently controlled by the current sense amplifier.

In order to avoid the voltage drop caused by the reading current in this wiring resistance, a method of setting the resistance of the magnetroresistive element high and decreasing the reading current is considered. However, this involves a problem that a reading speed is made slow.

Avoiding the voltage drop caused by the reading current in the wiring resistance is important in improving the reliability of the reading, even in the object other than the decrease in the wraparound current. For example, when a reading circuit supplies a constant voltage V1, detects the reading current flowing through the magnetoresistive element and then judges the storage state, a reading voltage V2 applied to the magnetoresistive element is lower than V1 by a voltage drop ΔV caused by the reading current in the wiring resistance and the transistor. The voltage drop ΔV is changed, depending on the storage information of the magnetoresistive element. It is assumed that the voltage drop is assumed to be ΔVL when the magnetoresistive element is in a low resistance state and the voltage drop is assumed to be ΔVH when the magnetoresistive element is in a high resistance state. Then, with regard to an absolute value, ΔVL is larger than ΔVH. In short, in the low resistance state, the reading voltage tends to be low because of the influence of the voltage drop, and the reading current tends to be decreased. Thus, with the influence of the voltage drop caused by the wiring resistance and the transistor, the difference between the reading current in the low resistance state and the reading current in the high resistance state is reduced, thereby reducing the reliability of the reading.

DISCLOSURE OF THE INVENTION

Therefore, an object of the present invention is to provide a technique for improving reliability of read data in a magnetic random access memory.

In one aspect of the present invention, a magnetic random access memory includes: first and second bit lines that are provided to extend in a first direction; a storage block that includes at least one magnetoresistive element for storing data; and a reading circuit. The reading circuit includes a first terminal that is electrically connected to the first bit line, and a second terminal that is electrically connected to the second bit line. The second terminal has a high impedance that prevents a steady-state current from flowing into at a time of a reading operation. The reading circuit supplies a reading current from the first terminal to the first bit line at the time of the reading operation. The storage block is configured such that the reading current flows from the first bit line to the magnetoresistive element and the magnetoresistive element is connected to the second bit line at the time of the reading operation. The reading circuit controls the reading current on the basis of a voltage applied to the second terminal through the second bit line.

In another aspect of the present invention, a magnetic random access memory includes: first and second bit lines that are provided to extend in a first direction; a storage block that includes at least one magnetoresistive element for storing data; and a reading circuit. The reading circuit includes a first terminal that is electrically connected to the first bit line, and a second terminal that is electrically connected to the second bit line. The second terminal includes a high impedance that prevents a steady-state current from flowing into at a time of a reading operation. The reading circuit supplies a constant reading current from the first terminal to the first bit line at the time of the reading operation. The storage block is configured such that the reading current flows from the first bit line to the magnetoresistive element at the time of the reading operation and the magnetoresistive element is connected to the second bit line. The reading circuit determines the data on the basis of a voltage applied to the second terminal through the second bit line.

In still another aspect of the present invention, an operating method of a magnetic random access memory that includes: first and second bit lines that are provided to extend in a first direction; a magnetoresistive element for storing data; and a reading circuit, wherein the reading circuit includes a first terminal and a second terminal, and the second terminal has a high impedance that prevents a steady-state current from flowing into at a time of a reading operation is provided. The operating method includes:

supplying a reading current from the first terminal through the first bit line to the magnetoresistive element by the reading circuit;

electrically connecting one end of the magnetoresistive element to the second bit line; and controlling the reading current on the basis of a voltage applied to the second terminal through the second bit line by the reading circuit.

According to the present invention, it is possible to provide the magnetic random access memory in which the reliability of the read data is high.

BRIEF DESCRIPTION OF THE DRAWINGS

FIG. 23A is a block diagram schematically showing a configuration of a MRAM in a fifth embodiment;

BEST MODE OF CARRYING OUT THE INVENTION

First Embodiment (Circuit Configuration)

Figure 1:
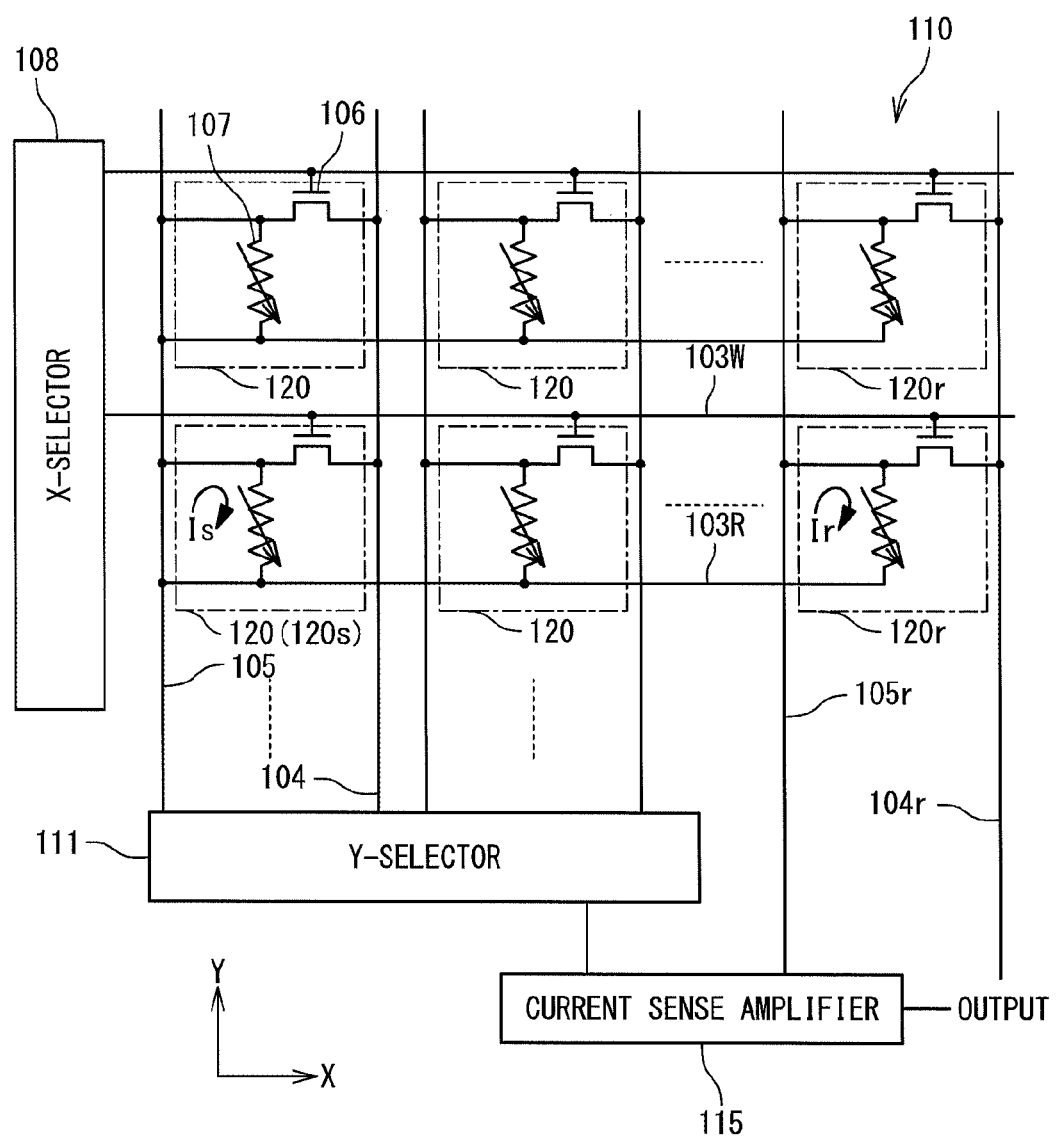
FIG. 1 is a circuit diagram showing a configuration of the known MRAM.
Figure 2:
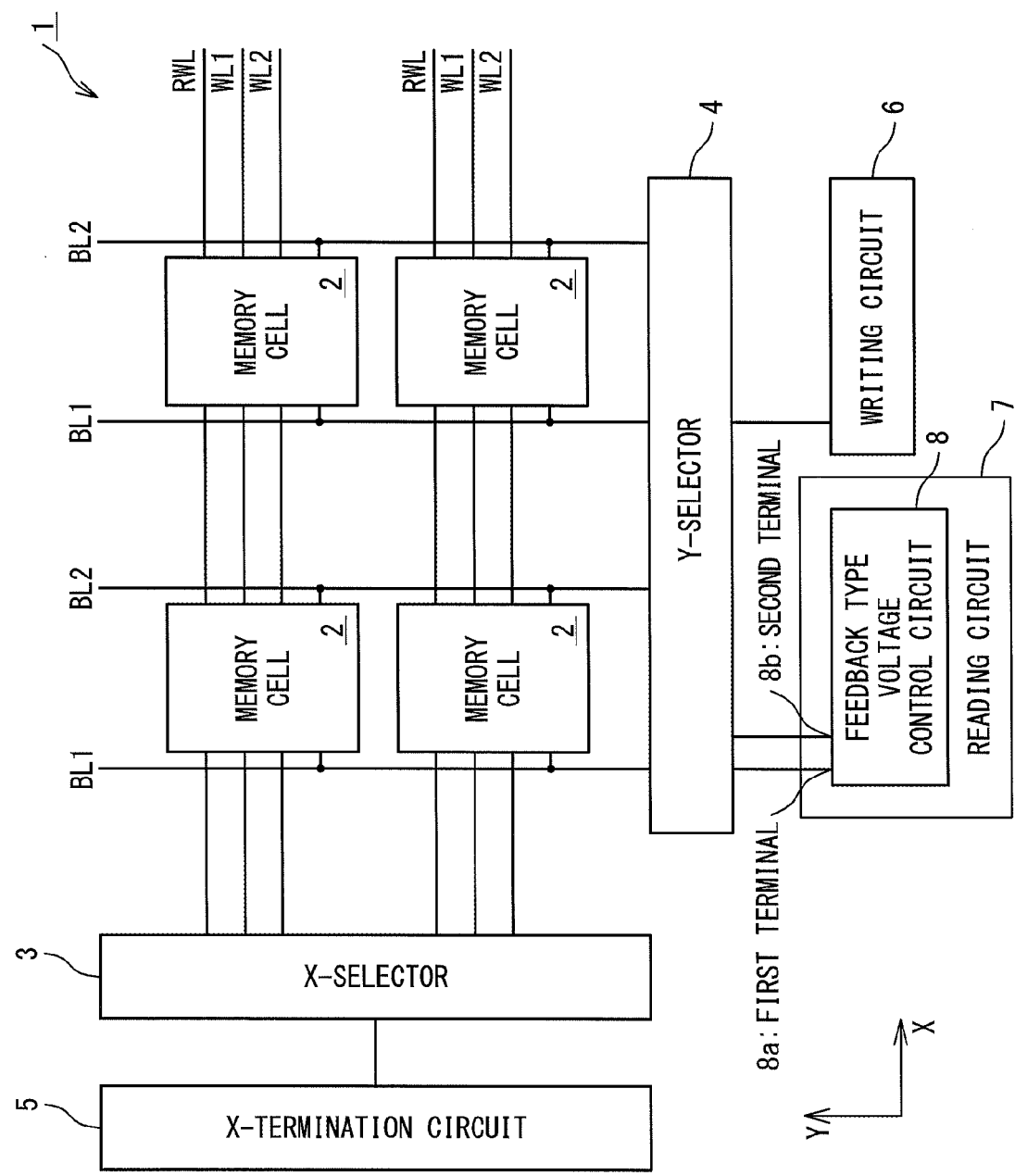
FIG. 2 is a block diagram schematically showing a configuration of a MRAM in a first embodiment.

FIG. 2 is a block diagram schematically showing a configuration of a MRAM in the first embodiment of the present invention. The MRAM includes a memory cell array 1 in which a plurality of memory cells 2, each functioning as a storage block for storing data, are arranged in the shape of a matrix.

A plurality of first word lines WL1, a plurality of second word lines WL2, a plurality of reading word lines RWL, and a plurality of bit line pairs, each of which is composed of a first bit line BL1 and a second bit line BL2, are provided in the memory cell array 1. The first word line WL1, the second word line WL2 and the reading word line RWL are provided to extend in an X-axis direction. On the other hand, the first bit line BL1 and the second bit line BL2 are provided to extend in a Y-axis direction, and the first bit line BL1 and the second bit line BL2, which belong to the same bit line pair, are commonly connected to the memory cells 2 on one column, which are arranged in a line in the Y-axis direction. Incidentally, the Y-axis direction is the direction perpendicular to the X-axis direction.

Figure 3:
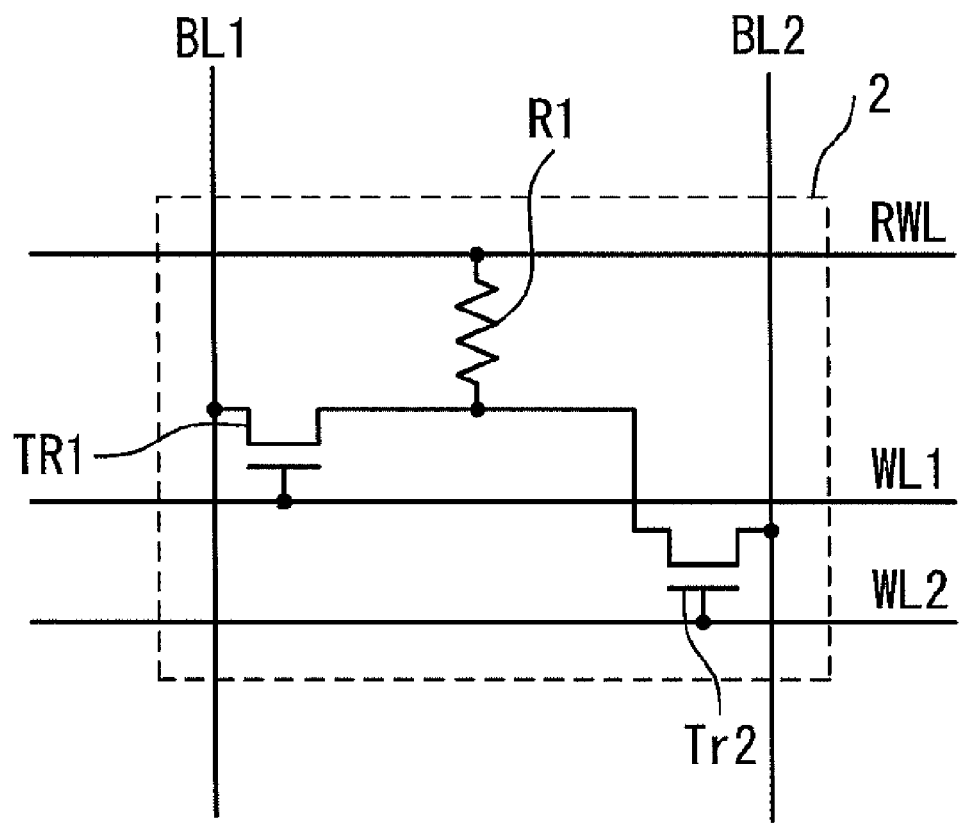
FIG. 3 is a circuit diagram showing a configuration of a memory cell in the first embodiment.

FIG. 3 shows a configuration example of one memory cell 2. In this embodiment, one memory cell 2 includes cell transistors Tr1, Tr2 and a magnetoresistive element R1. A gate of the cell transistor Tr1 is connected to the first word line WL1. One of source/drain of the first transistor Tr1 is connected to the first bit line BL1, and the other is connected to one terminal of the magnetoresistive element R1 and also connected to one of source/drain of the cell transistor Tr2. The other terminal of the magnetoresistive element R1 is connected to the reading word line RWL. The other of the source/drain of the cell transistor Tr2 is connected to the second bit line BL2. A gate of the cell transistor Tr2 is connected to the second word line WL2. As described later, attention should be paid to a fact that the configuration of the memory cell 2 can be variously changed.

Again with reference to FIG. 2, the MRAM in the first embodiment further includes an X-selector 3 and an X-termination circuit 5. The X-selector is connected to the plurality of first word lines, the plurality of second word lines and the plurality of reading word lines. When data is read or when data is written, the X-selector can select the necessary first word line and second word line. The X-termination circuit 5 is connected to the X-selector 3.

The MRAM in the first embodiment further includes a Y-selector 4, a writing circuit 6, and a reading circuit 7. The Y-selector 4 is connected to the first bit line BL1 and the second bit line BL2. When data is read and when data is written, the Y-selector 4 selects the first bit line BL1 and the second bit line BL2, which correspond to the memory cell 2 to be accessed.

The writing circuit 6 and the reading circuit 7 are connected through the Y-selector 4 to the first bit line BL1 and the second bit line BL2. The writing circuit 6 has a function for supplying a writing current by applying complementary voltages to the first bit line BL1 and the second bit line BL2, on the basis of write data.

The reading circuit 7 has a function for supplying a reading current to the magnetoresistive element R1 in each memory cell 2 so that a predetermined reading voltage is accurately applied to the magnetoresistive element R1 in each memory cell 2, and further determining read data.

In detail, the reading circuit 7 includes a feedback type voltage control circuit 8. A first terminal 8a of the feedback type voltage control circuit 8 is connected through the Y-selector 4 to the first bit line BL1, and a second terminal 8b is connected through the Y-selector 4 to the second bit line BL2. The feedback type voltage control circuit 8 is configured to supply the reading current to the first bit line BL1 connected to the first terminal 8a, on the basis of a voltage applied to the second terminal 8b.

Figure 10:
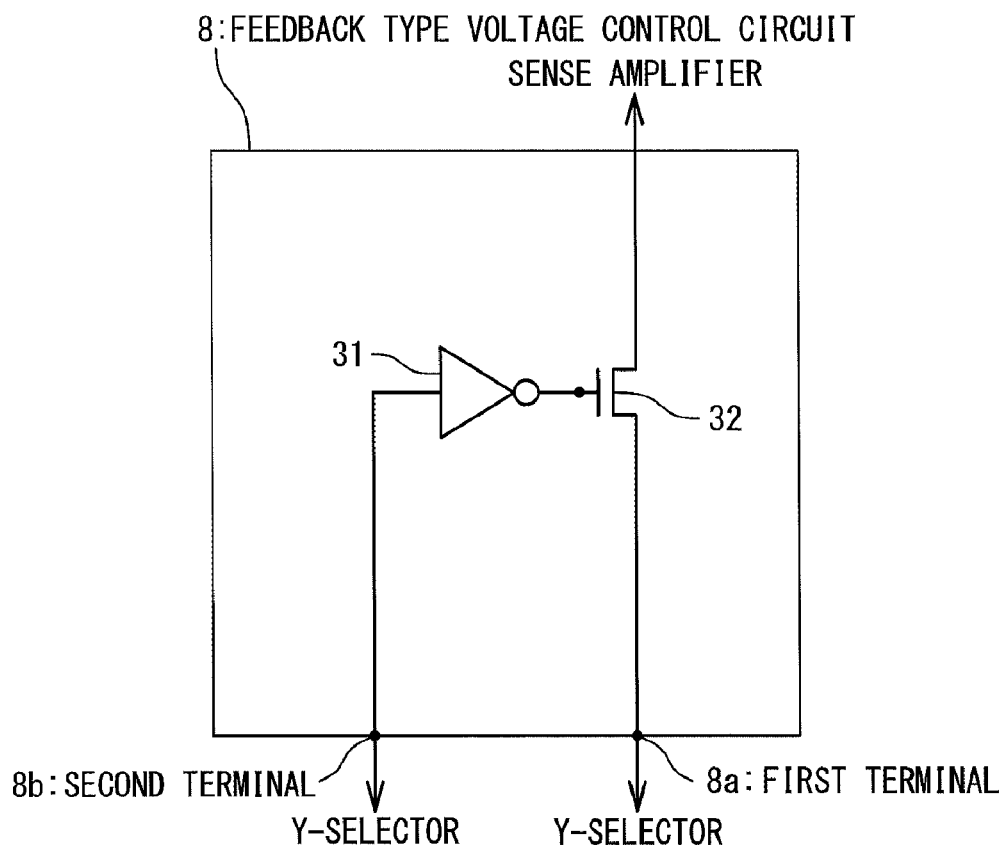
FIG. 10 is a view showing an example of a configuration of a feedback type voltage control circuit included in a reading circuit in the MRAM in the first embodiment.

FIG. 10 shows a circuit configuration example of the feedback type voltage control circuit 8 in this embodiment. In the circuit configuration shown in FIG. 10, the feedback type voltage control circuit 8 includes a CMOS inverter 31 and an NMOS transistor 32. An input of the inverter 31 is connected to the second terminal 8b, and an output of the inverter 31 is connected to a gate of the NMOS transistor 32. A drain of the NMOS transistor 32 is connected to a sense amplifier (not shown) of a next stage, and a source is connected to the first terminal 8a. The feedback type voltage control circuit 8 configured in this way carries out an operation for adjusting a reading current which flows from the first terminal 8a so that a voltage of the second terminal 8b is fixed to a threshold voltage of the inverter 31 (namely, a voltage when the output of the inverter 31 is switched from a power source level Vdd to a ground level Gnd, or vice versa). The inverter 31 is designed such that the threshold voltage becomes equal to a reading voltage which should be applied to the magnetoresistive element R1 at the time of the reading operation. Such a design can be easily attained by properly selecting dimensions of a NMOS transistor and a PMOS transistor that are included in the CMOS inverter 31.

In the configuration of the feedback type voltage control circuit 8, attention should be paid to a fact that the second terminal 8b of the feedback type voltage control circuit 8 has a "high impedance" for an earth. That is, when a voltage is applied to the second terminal 8b of the feedback type voltage control circuit 8 in the reading operation, a steady-state current flowing through the second terminal 8b is zero (0) (except a leak current). As described later, the fact that the second terminal 8b has the high impedance for the earth contributes to the improvement of the reliability of the read data.

(Reading Operation)

The reading operation will be described later.

Figure 11:
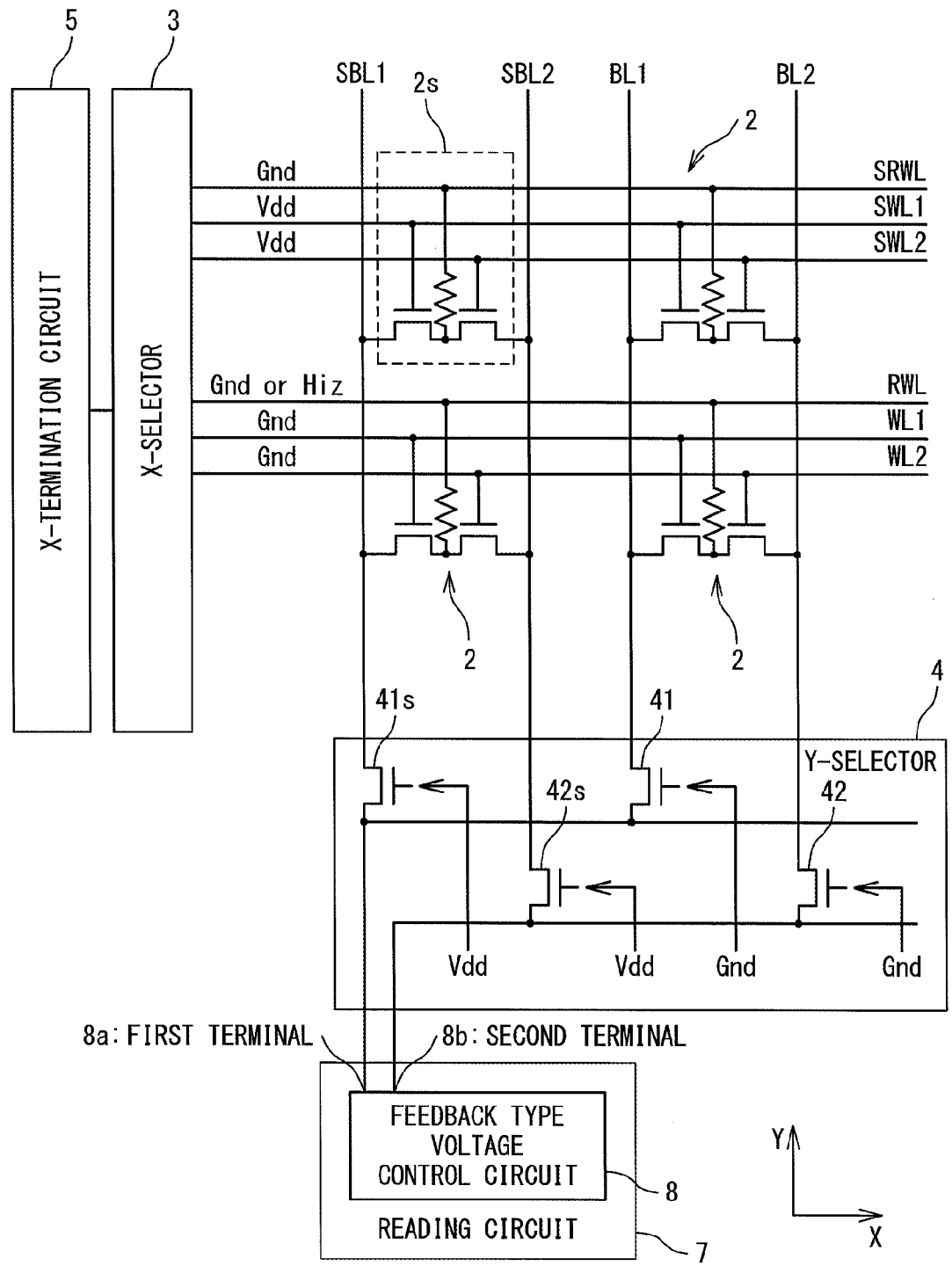
FIG. 11 is a circuit diagram describing a reading operation in the first embodiment.

FIG. 11 is a block diagram showing portions related to reading from the MRAM in this embodiment. Hereinafter, the memory cell 2 of an access target is referred to as a selected memory cell 2s. Also, the first bit line BL1, which is connected to the selected memory cell and selected by the Y-selector 4, is hereinafter referred to as a selected first bit line SBL1. Similarly, the second bit line BL2, which is connected to the selected memory cell 2s and selected by the Y-selector 4, is referred to as a selected second bit line SBL2. Also, the first word line WL1, which is connected to the selected memory cell 2s and selected by the X-selector 3, is hereinafter referred to as a selected first word line SWL1. Similarly, the second word line WL2, which is connected to the selected memory cell 2s and selected by the X-selector 3, is hereinafter referred to as a selected second word line SWL2. Finally, the reading word line RWL, which is connected to the selected memory cell 2s and selected by the X-selector 3, is hereinafter referred to as a selected reading word line SRWL.

The cell transistor Tr1 and the cell transistor Tr2 in the selected memory cell 2s are turned on when the selected first word line SWL1 and the selected second word line SWL2 are pulled up to the power source level Vdd. On the other hand, the selected reading word line SRWL is grounded. The reading word lines RWL except the selected reading word line SRWL are grounded or set to a floating state. Since the cell transistor Tr1 and the cell transistor Tr2 are turned on in the selected memory cell 2s, the selected first bit line SBL1 and the selected second bit line SBL2 are electrically connected to the magnetroresistive element R1 in the selected memory cell 2s.

In addition, the Y-selector 4 turns on a transistor 41s connected to the selected first bit line SBL1 and a transistor 42s connected to the selected second bit line SBL2, in transistors 41, 42. Consequently, the selected first bit line SBL1 is electrically connected to the first terminal 8a of the feedback type voltage control circuit 8, and the selected second bit line SBL2 is electrically connected to the second terminal 8b of the feedback type voltage control circuit 8. The first bit lines BL1 except the selected first bit line SBL1 and the second bit lines BL2 except the selected second bit line SBL2 are grounded or set to the floating state.

The feedback type voltage control circuit 8 adjusts the reading current flowing from the first terminal 8a so that a difference between a voltage of the second terminal 8b and a defined reading voltage Vc (a threshold voltage of the inverter 31 in this embodiment) becomes small. The reading current flowing from the first terminal 8a flows through the Y-selector 4, the selected first bit line SBL1, the cell transistor Tr1 and the magnetroresistive element R1 to the selected reading word line SRWL of a grounded potential.

Since the reading current flows, the voltage generated in the magnetroresistive element R1 is supplied through the cell transistor Tr2 in the selected memory cell 2s, the selected second bit line SBL2 and the Y-selector 4 to the second terminal 8b of the feedback type voltage control circuit 8. Since the input resistance of the second terminal 8b is great, the current does not flow through the selected second bit line SBL2 in the steady state. For this reason, the influence of the voltage drop caused by the resistance of the selected second bit line SBL2 is hardly included in the voltage supplied to the second terminal 8b. Similarly, the influences of the voltage drops in the cell transistor Tr2 and the Y-selector 4 are small. As a result, the reading circuit 7 applies the voltage approximately equal to the defined reading voltage Vc to the magnetroresistive element R1 in the selected memory cell 2s while minimizing the influence of parasitic resistances.

The sense amplifier (not shown) in the reading circuit 7 detects the reading current and determines the data stored in the magnetroresistive element R1 in the selected memory cell 2s. The voltage applied to the magnetroresistive element R1 is controlled to the defined reading voltage Vc. Thus, the value of the reading current is determined by the resistance value of the magnetroresistive element R1, namely, the data stored in the magnetroresistive element R1. The value of the reading current does not substantially suffer from the parasitic resistances. Hence, the MRAM in this embodiment has the high reliability of the read data.

As described above, the MRAM in the first embodiment can accurately apply the desirable reading voltage to the magnetroresistive element and consequently read the data at the high reliability.

Moreover, the MRAM in the first embodiment is advantageous in that the magnetroresistive element whose resistance value is small can be used. The conventional MRAM has a problem that, when the magnetroresistive element whose resistance value is low is applied, the voltage drops of the bit line and the transistor become great, which results in the decrease in the signal level of the reading signal. In the MRAM in the first embodiment, since the influence of the voltage drop caused by the parasitic resistances can be removed, the magnetroresistive element whose resistance value is low can be applied. The fact that the magnetroresistive element whose resistance value is low can be applied is advantageous in that the time when the capacitances of the bit line and the sense amplifier are charged can be made short and the read speed can be made fast.

Moreover, in the MRAM in the first embodiment, it becomes easy to integrate a plurality of MRAM macros into a system LSI. Conventionally, the cross point type MRAM uses the magnetroresistive element whose resistance value is high, as compared with the MRAM that includes a cell transistor for each memory cell. In a case that the macro of the cross point type MRAM and the macro of the MRAM that includes the cell transistor for each memory cell are mixed in the system LSI, when the magnetroresistive elements of the same shape are used, the resistance values of the magnetroresistive elements become equal. When the resistance value of the magnetroresistive element is set to the lower side, the reading operation from the cross point type MRAM becomes difficult because of the influence of the parasitic resistances. On the other hand, when the resistance value of the magnetroresistive element is set to the high side, the reading speed from the MRAM macro that includes the cell transistor for each memory cell is made slow, and a true abilities of the MRAM macro can't be demonstrated. On the other hand, even if the magnetroresistive element of the MRAM in this embodiment is designed to have the same resistance value as the resistance value of the magnetroresistive element in the memory cell that is applied to the other MRAM macros, there is no problem. This is because irrespectively of the value of the magnetroresistive element, the reading voltage can be accurately applied to the magnetroresistive element, and the reliability of the reading is not lost.

The reading operation from the MRAM in the first embodiment is especially preferable in a case that two bit lines are provided for the memory cells of one column. In the MRAM in this embodiment, the data writing is carried out by applying the complementary voltages to the bit line pair and supplying the writing current to only the selected memory cell. The MRAM in this embodiment can be commonly used at the times of the writing operation and the reading operation. For the sake of the writing operation and the reading operation, different bit lines are not required to be prepared. This is effective for reducing the area of the memory cell array.

Incidentally, the configuration of the MRAM can be variously changed. The variation example of the MRAM in this embodiment will be described below.

Figure 4:
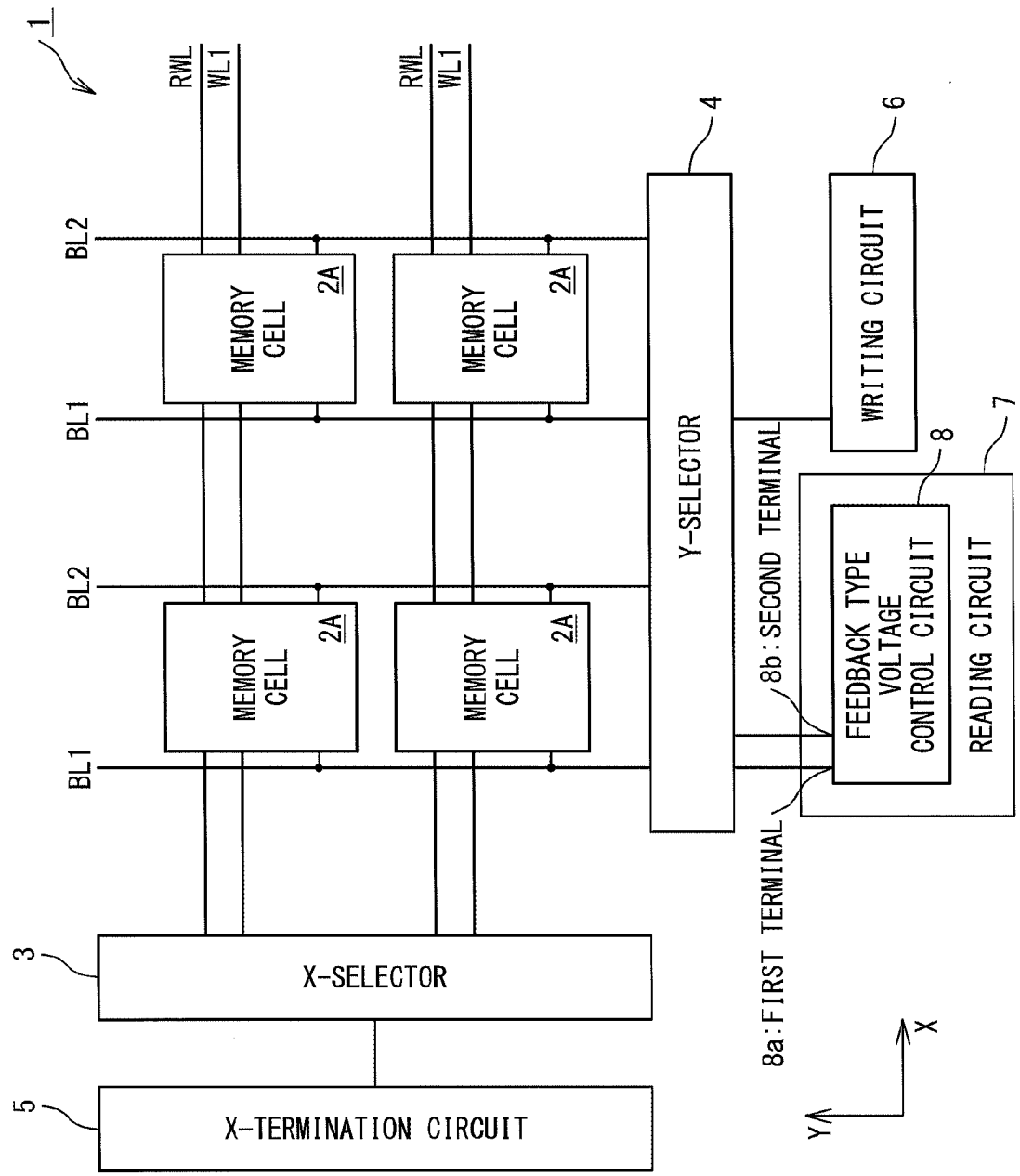
FIG. 4 is a block diagram schematically showing a configuration of a MRAM in a first variation example in the first embodiment.
Figure 5:
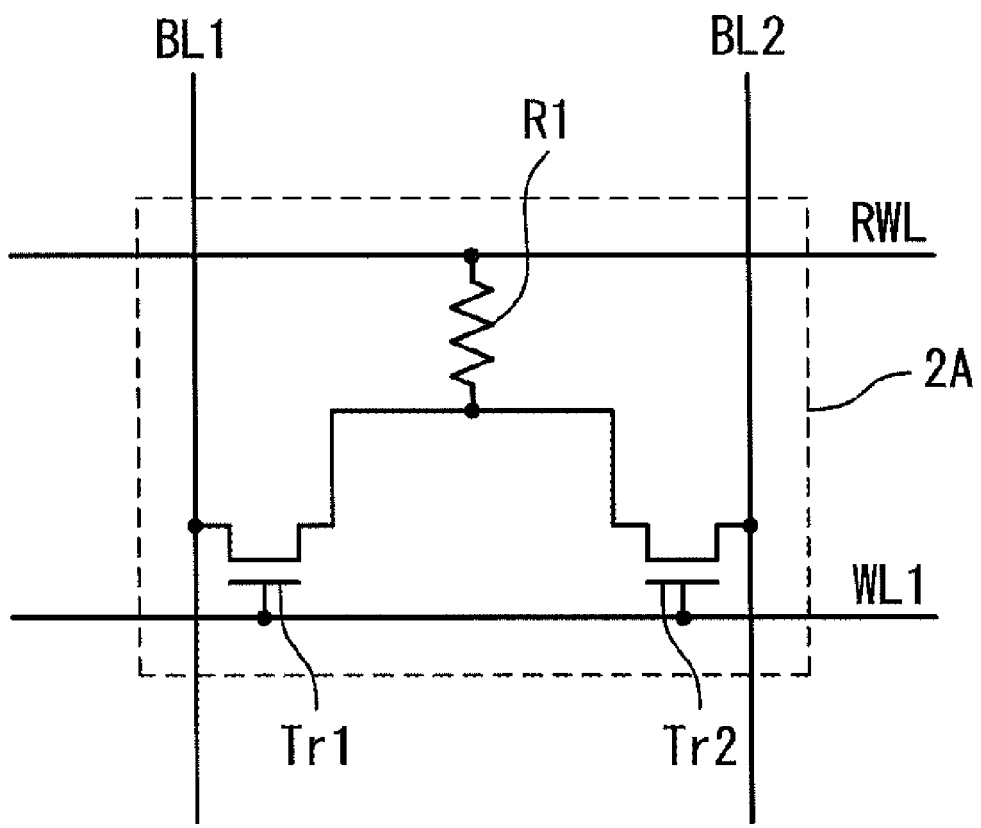
FIG. 5 is a circuit diagram showing a configuration of a memory cell in the first variation example in the first embodiment.

FIG. 4 is a block diagram showing a configuration of the MRAM in the first variation example. FIG. 5 is a circuit diagram showing a configuration of a memory cell 2A of the MRAM in the first variation example. As shown in FIG. 4 and FIG. 5, gates of the cell transistor Tr1 and the cell transistor Tr2 may be commonly connected to the first word line WL1. In the writing operation and the reading operation, when the selected first word line WL1 is pulled up, the cell transistor Tr1 and the cell transistor Tr2 are turned on.

Figure 6:
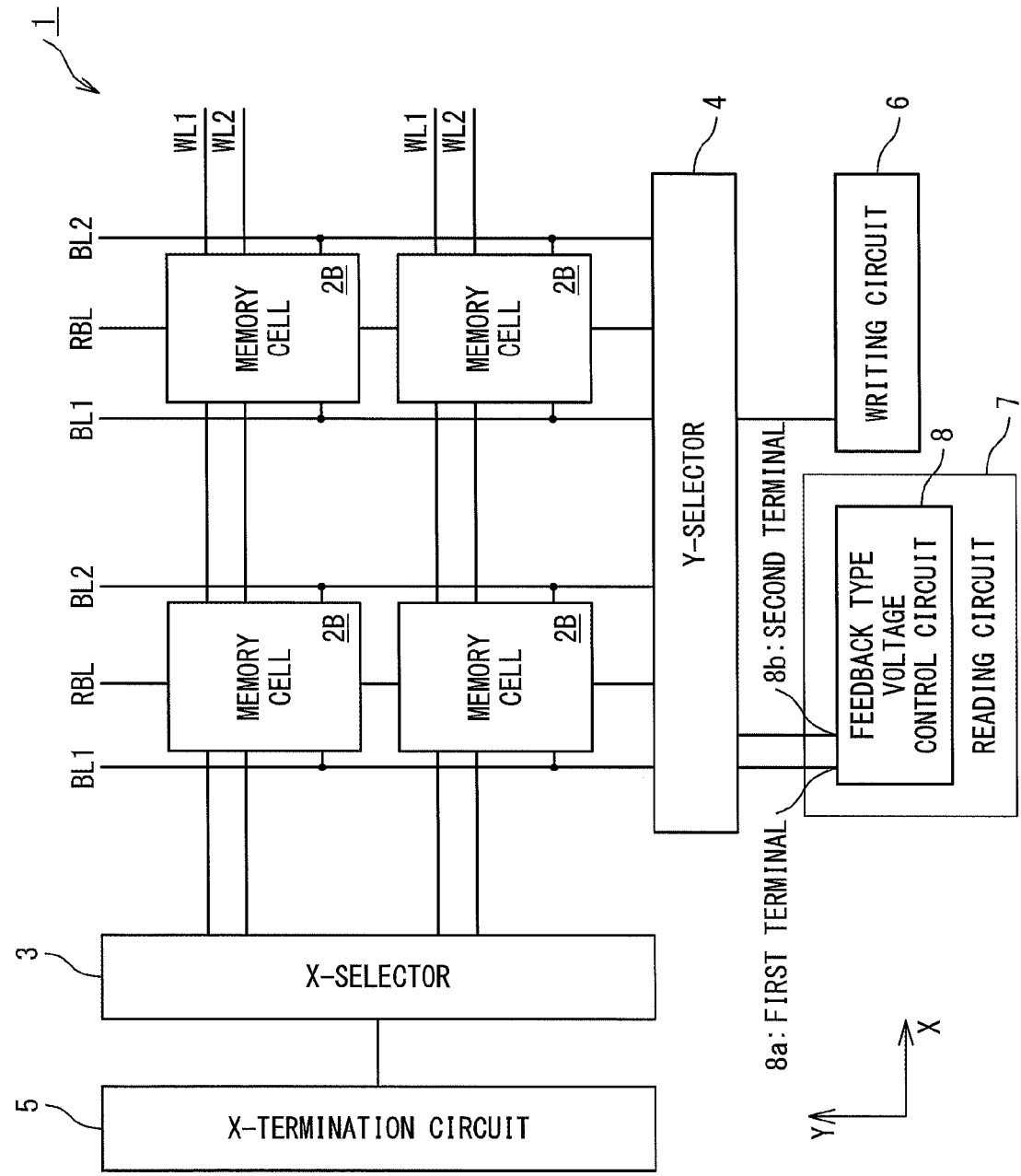
FIG. 6 is a block diagram schematically showing a configuration of a MRAM in a second variation example in the first embodiment.
Figure 7:
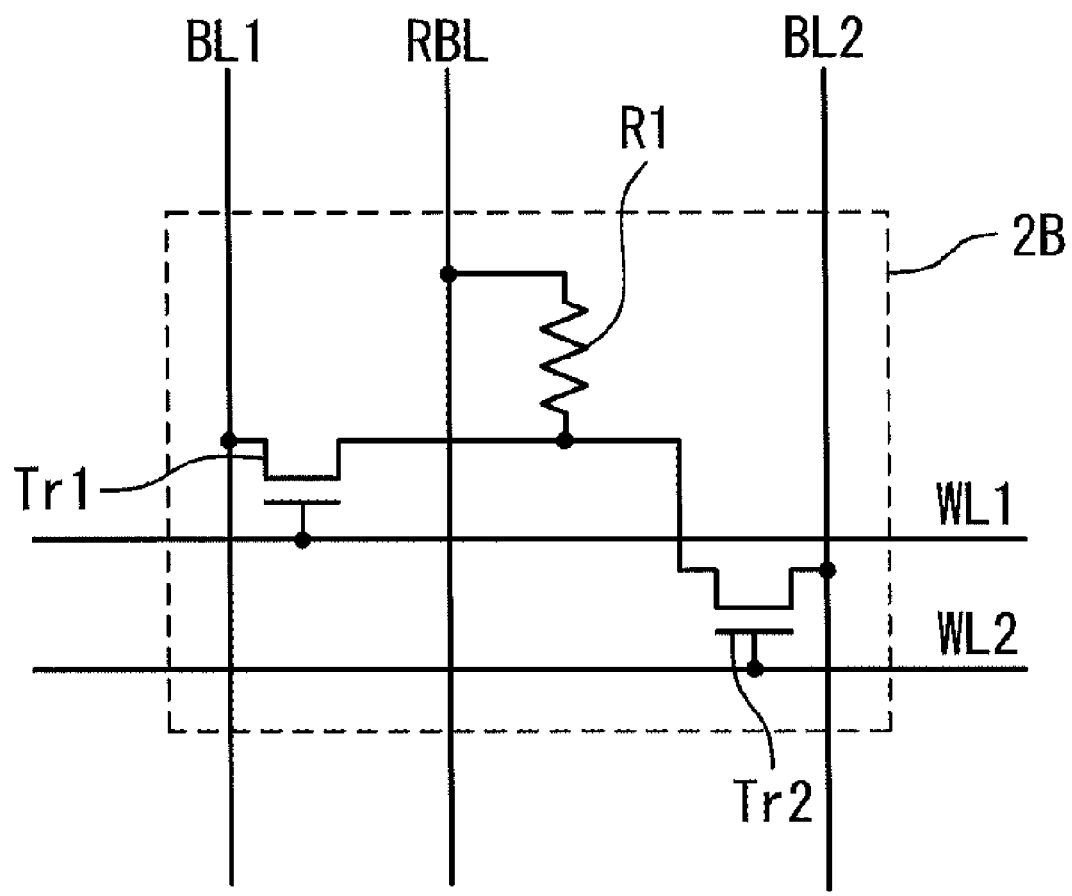
FIG. 7 is a circuit diagram showing a configuration of a memory cell in the second variation example in the first embodiment.

FIG. 6 is a block diagram showing a configuration of the MRAM in the second variation example. FIG. 7 is a circuit diagram showing a configuration of a memory cell 2B of the MRAM in the second variation example. As shown in FIG. 6 and FIG. 7, instead of the reading word line RWL, a reading bit line RBL that is provided to extend in the Y-axis direction may be arranged. Each reading bit line RBL is connected to the magnetroresistive element R1 of each memory cell 2B and also connected to the Y-selector 4. At the time of the reading operation, the reading bit line RBL connected to the selected memory cell is grounded.

Figure 8:
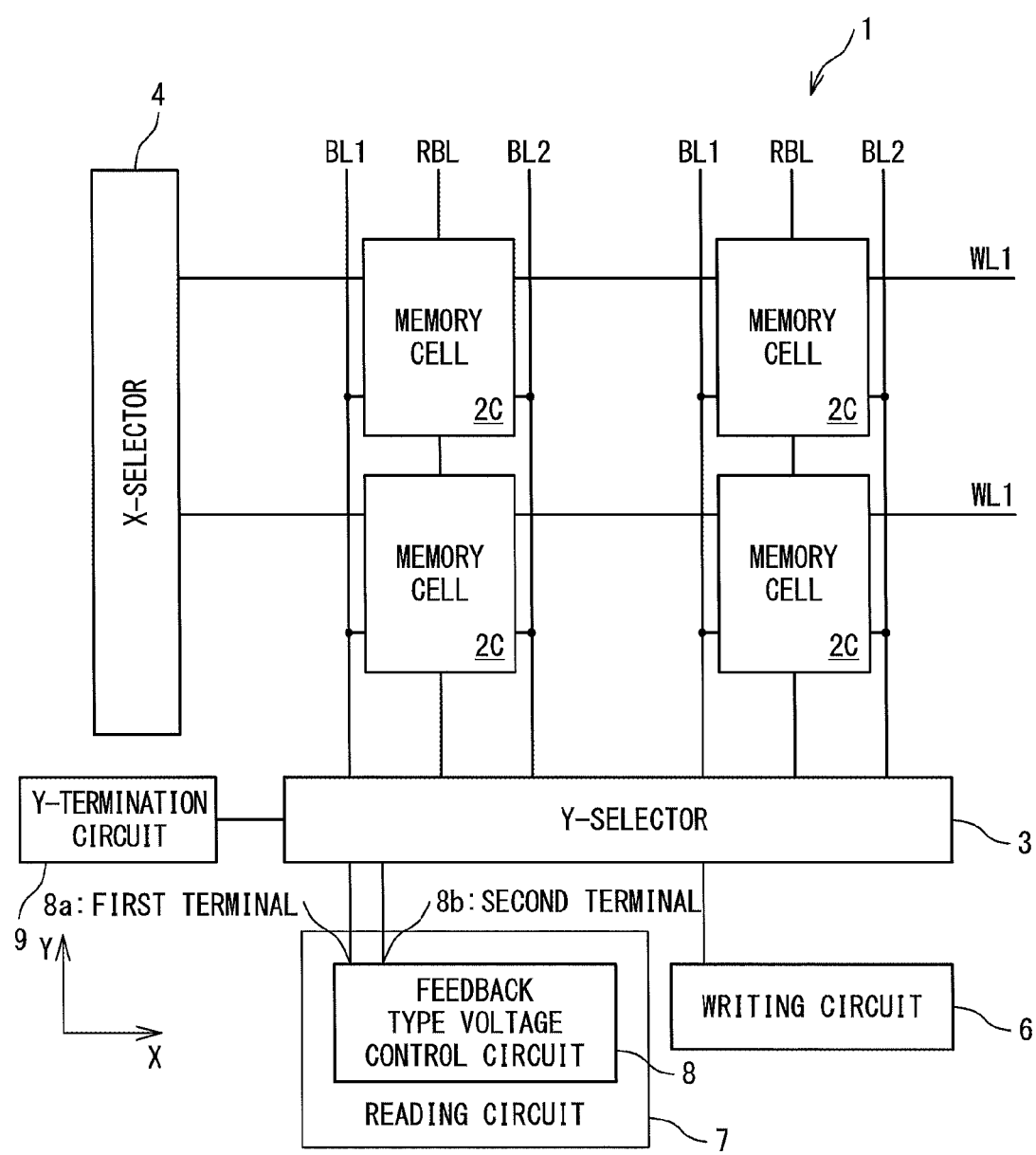
FIG. 8 is a block diagram schematically showing a configuration of a MRAM in a third variation example in the first embodiment.
Figure 9:
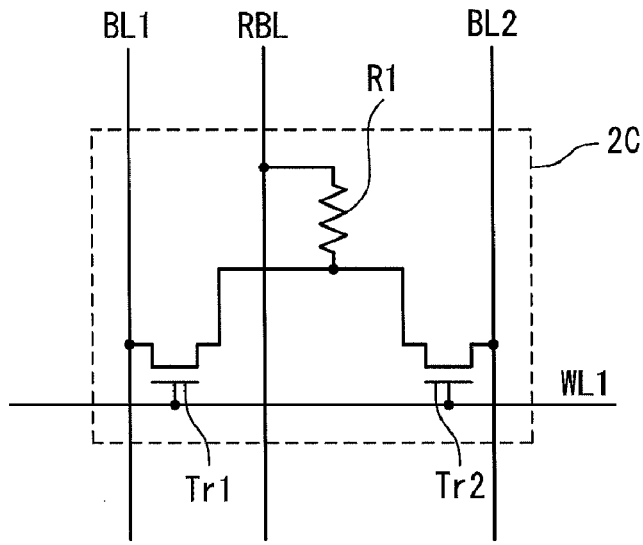
FIG. 9 is a circuit diagram showing a configuration of a memory cell in the third variation example in the first embodiment.

FIG. 8 is a block diagram showing a configuration of the MRAM in the third variation example, and FIG. 9 is a circuit diagram showing a configuration of a memory cell 2B of the MRAM in the third variation example. As shown in FIG. 8 and FIG. 9, even when the reading bit line RBL is used, it is possible to employ the configuration in which the gates of the cell transistor Tr1 and the cell transistor Tr2 are commonly connected to the first word line WL1.

Second Embodiment (Circuit Configuration)

Figure 12:
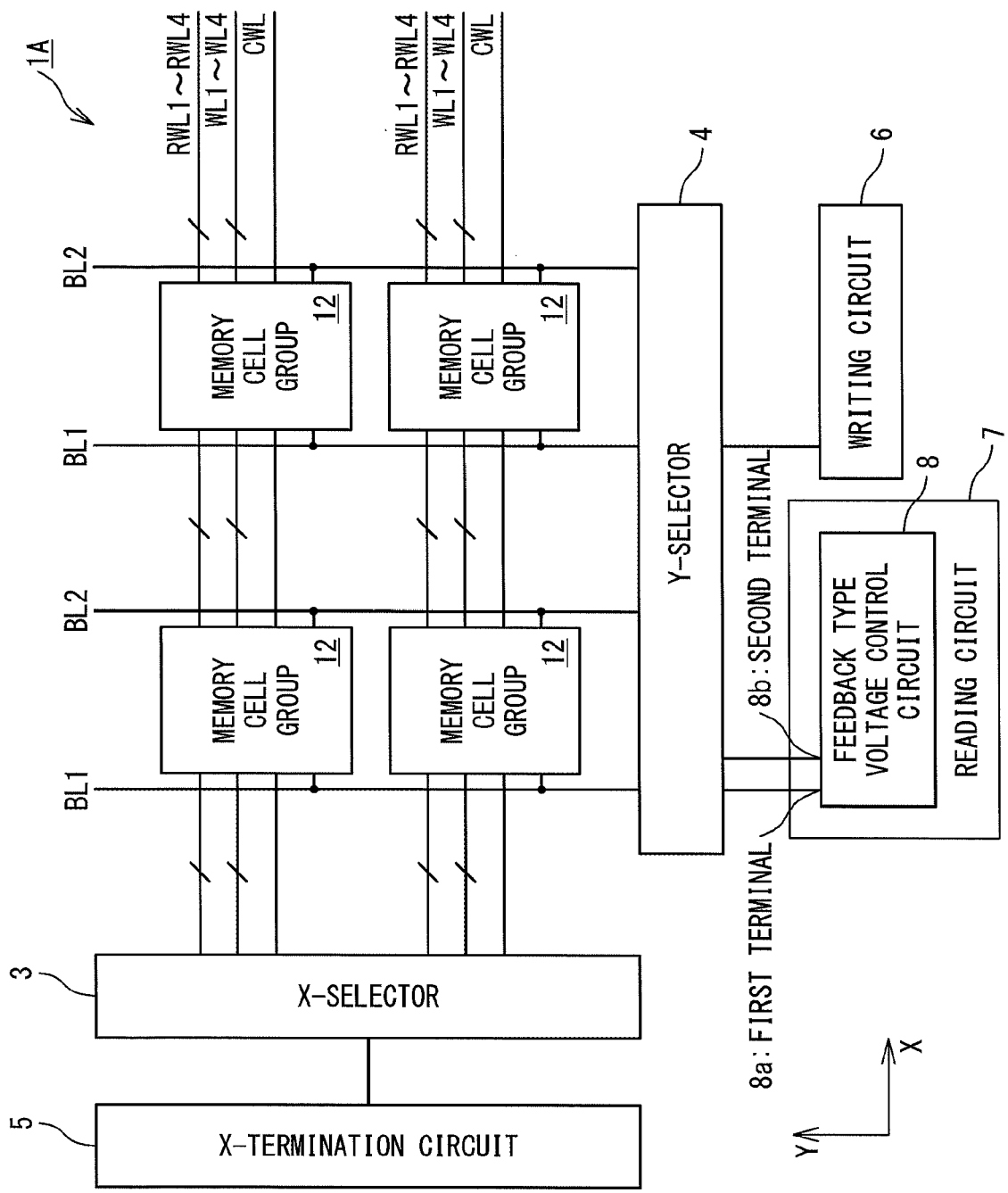
FIG. 12 is a block diagram schematically showing a configuration of a MRAM in a second embodiment.

FIG. 12 is a block diagram schematically showing a configuration of the MRAM in the second embodiment of the present invention. The configuration of the MRAM in the second embodiment is similar to the configuration of the MRAM in the first embodiment. The great difference lies in a structure in which in the MRAM in the second embodiment, cell groups 12 each including a plurality of memory cells are arranged as a matrix in a memory cell array 1A. In the second embodiment, the four memory cells are integrated in each cell group 12, and each cell group 12 functions as a storage block for storing a 4-bit data. In the memory cell array 1A, one common word line CWL, four first to fourth word lines WL1 to WL4, and four reading word lines RWL1 to RWL4 are provided on one row of the cell group 12. The first to fourth word lines WL1 to WL4 and reading word lines RWL1 to RWL4 are used to select the desirable memory cell from the four memory cells that are integrated in each cell group 12.

Figure 13:
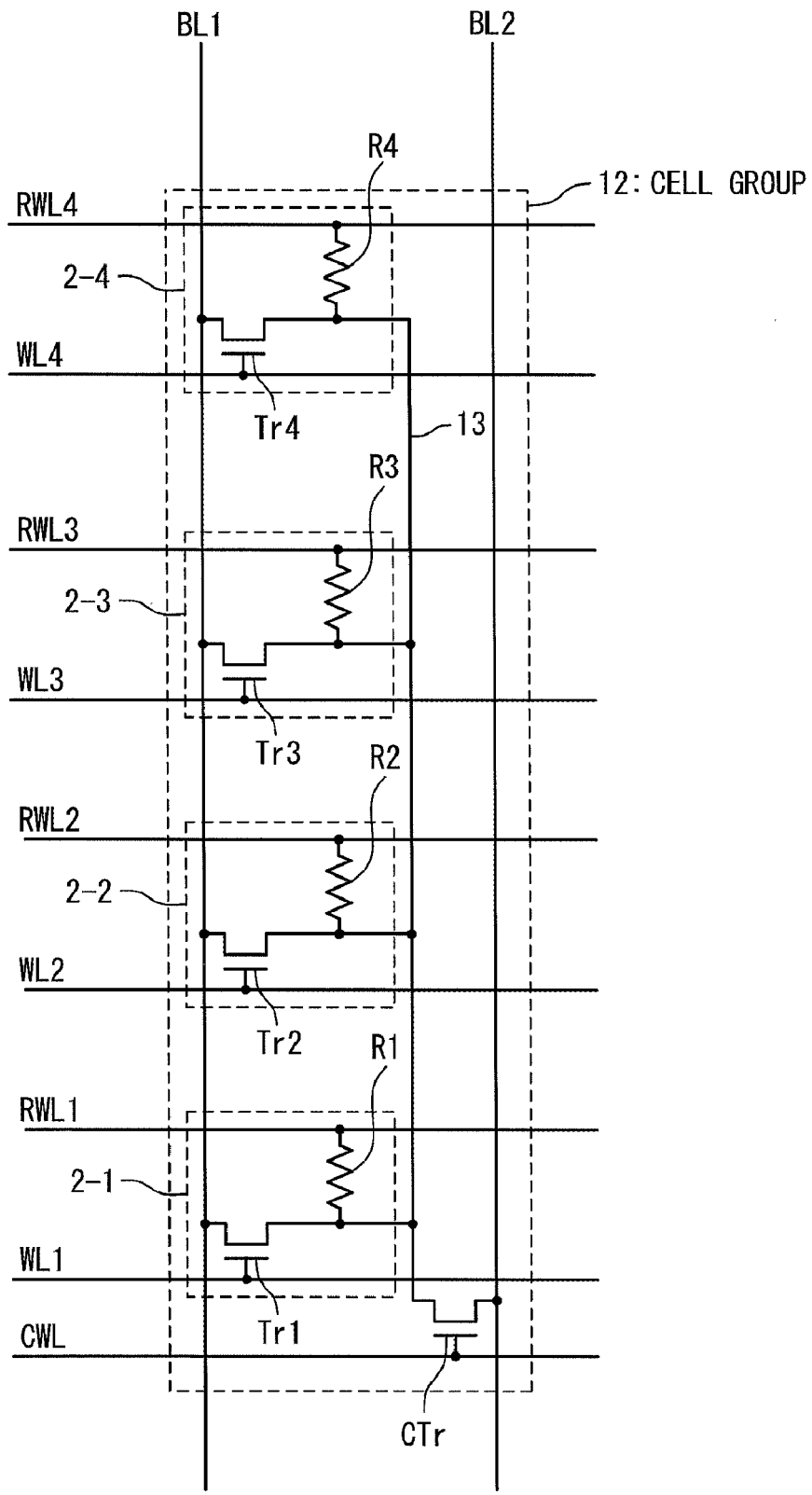
FIG. 13 is a circuit diagram showing a configuration of a cell group in the second embodiment.

FIG. 13 shows a configuration example of one cell group 12. In this embodiment, each cell group 12 includes four memory cells 2-1 to 2-4. The memory cells 2-1 to 2-4 are arranged in a line in the Y-axis direction. Each of the memory cells 2-1 to 2-4 includes one cell transistor and one magnetoresistive element. The cell transistors integrated in the memory cells 2-1 to 2-4 are referred to as the symbols Tr1 to Tr4, respectively, and the magnetroresistive elements integrated in the memory cells 2-1 to 2-4 are referred to as the symbols R1 to R4, respectively. Incidentally, the number of the memory cells included in one cell group 12 is arbitrary.

Gates of the cell transistors Tr1 to Tr4 in the memory cells 2-1 to 2-4 are connected to the first to fourth word lines WL1 to WL4, respectively. In each of the cell transistors Tr1 to Tr4, one of the source/drain is connected to the first bit line BL1, and the other is connected to a common line 13 and connected to one end of each of the magnetroresistive elements R1 to R4. The other ends of the magnetroresistive elements R1 to R4 are connected to the reading word lines RWL1 to RWL4, respectively.

Moreover, each cell group 12 includes a common transistor CTr. One common transistor CTr is formed commonly to the memory cells 2-1 to 2-4. A gate of the common transistor CTr is connected to the common word line CWL. One of the source/drain of the common transistor CTr is connected to the second bit line BL2, and the other is connected to the common line 13. In this way, the second bit line BL2 is connected through one common transistor CTr to all of the magnetroresistive elements R1 to R4. On the other hand, the first bit line BL1 is connected through the cell transistors Tr1 to Tr4 to the magnetroresistive elements R1 to R4.

(Reading Operation)

The reading operation will be described below.

Figure 14:
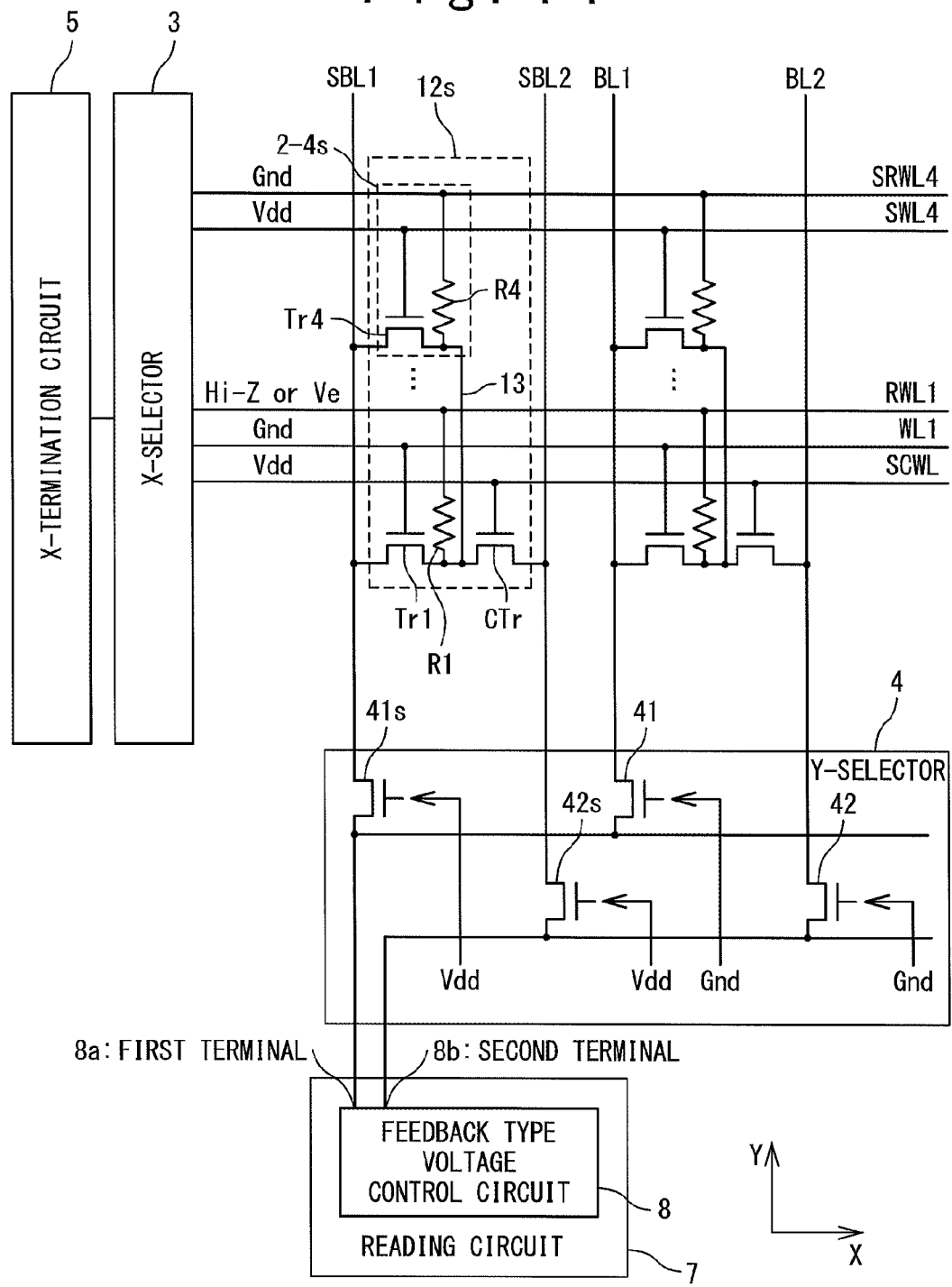
FIG. 14 is a circuit diagram describing a reading operation in the second embodiment.

FIG. 14 is a block diagram showing a configuration of portions related to the reading operation, with regard to the MRAM in this embodiment. In the following description, the memory cell of an access target is hereinafter referred to as a selected memory cell. Then, among the plurality of cell groups 12, the cell group including the selected memory cell is referred to as a selected cell group 12s. In the following description, the description is carried out under an assumption that the memory cell 2-4 in the selected cell group 12s is selected. Thus, the selected memory cell is referred to as a symbol 2-4s.

Also, the first bit line BL1 and the second bit line BL2, which are connected to the selected cell group 12s, are hereinafter referred to as a selected first bit line SBL1 and a selected second bit line SBL2. There is also a case that the selected first bit line SBL1 and the selected second bit line SBL2 are collectively referred to as a selected bit line pair.

Moreover, the common word line CWL selected by the X-selector 3 is hereinafter referred to as a selected common word line SCWL.

In addition, among the first to fourth word lines WL1 to WL4, the word line selected by the X-selector 3 is hereinafter referred to as a selected word line. In the following description, since the fourth word line WL4 corresponding to the selected memory cell 2-4s is selected, the selected word line is referred to as a symbol SWL4. The cell transistors Tr4 connected to the selected word line SWL4 are all turned on.

Finally, among the reading word lines RWL1 to RWL4, the reading word line selected by the X-selector 3 is hereinafter referred to as a selected reading word line. In the following description, the reading word line RWL4 corresponding to the selected memory cell 2-4s is selected. Thus, the selected reading word line is referred to as a symbol SRWL4.

When the reading operation is started, the X-selector 3 pulls up the selected common word line SCWL, which is connected to the selected cell group 12s, to the power source level Vdd. Consequently, the common transistor CTr connected to the selected common word line SCWL is turned on. In short, the cell groups 12 connected to the selected common word line SCWL are all selected.

Moreover, the X-selector 3 selects the selected word line SWL4 connected to the selected cell group 12s and pulls up the selected word line SWL4 to the power source level Vdd. As a result, the cell transistor Tr4 in the selected memory cell 2-4s is turned on.

On the other hand, the X-selector 3 applies the ground voltage to the common word lines CWL and the word lines except the selected common word line SCWL and the selected word line SWL4. As a result, the cell transistors in the non-selected memory cells are turned off.

Moreover, the X-selector 3 sets the selected reading word line SRWL4, which is connected to the selected memory cell 2-4s, to the ground potential. In addition, the X-selector 3 sets the reading word lines RWL1 to RWL3 connected to the selected cell group 12s except the selected reading word line SRWL4, to the floating state, or applies a voltage Ve equal to the defined reading voltage Vc. Moreover, the X-selector 3 connects the reading word lines RWL1 to RWL4, which are not connected to the selected cell group 12s, to the ground or sets to the floating state.

With the foregoing operation, the selected first bit line SBL1 is electrically connected to the magnetoresistive element R4 through the cell transistor Tr4 in the selected memory cell 2-4s, and the selected second bit line SBL2 is connected to the magnetoresistive element R4 through the common transistor CTr in the selected cell group 12s.

In addition, the Y-selector 4 turns on the transistor 41s connected to the selected first bit line SBL1 and the transistor 42s connected to the selected second bit line SBL2. Consequently, the selected first bit line SBL1 is electrically connected to the first terminal 8a of the feedback type voltage control circuit 8, and the selected second bit line SBL2 is electrically connected to the second terminal 8b. The first bit lines BL1 except the selected first bit line SBL1 and the second bit lines BL2 except the selected second bit line SBL2 are grounded or set to the floating state.

The reading current, which flows from the first terminal 8a of the feedback type voltage control circuit 8, flows through the Y-selector 4, the selected first bit line SBL1, and the cell transistor Tr4 and magnetoresistive element R4 in the selected memory cell 2-4s to the selected reading word line SRWL4 of the ground potential. The voltage applied to the magnetoresistive element R4 is supplied through the common transistor CTr of the selected cell group 12s, the selected second bit line SBL2 and the Y-selector 4 to the second terminal 8b of the feedback type voltage control circuit 8. Since the input impedance of the second terminal 8b is high, the current does not flow through the selected second bit line SBL2 in the steady state. For this reason, the influence of the voltage drop caused by the resistance of the selected second bit line SBL2 is hardly included in the voltage supplied to the second terminal 8b. Similarly, the influence of the voltage drop in the Y-selector 4 is small. The feedback type voltage control circuit 8 adjusts the reading current flowing from the first terminal 8a so that a difference between the voltage of the second terminal 8b and the defined reading voltage Vc is reduced. As a result, the reading circuit 7 can apply the voltage, which is substantially equal to the defined reading voltage Vc, to the magnetoresistive element R4, while suppressing the influence of the parasitic resistances to the minimum.

The sense amplifier (not shown) in the reading circuit 7 detects the reading current and determines the data stored in the magnetoresistive element R4 in the selected memory cell 2s. Since the voltage applied to the magnetoresistive element R4 is controlled to the defined reading voltage Vc, the value of the reading current is determined by the resistance value of the magnetoresistive element R4, namely, the data stored in the magnetoresistive element R4. The value of the reading current is not substantially influenced by the parasitic resistances. Thus, the MRAM in this embodiment has the high reliability of the read data.

The MRAM in the second embodiment has the merit similar to the MRAM in the first embodiment. That is, in the MRAM in the second embodiment, since the reading voltage can be accurately applied, the data can be surely read. In addition, in the MRAM in the second embodiment, the magnetoresistive element whose resistance value is low can be applied, and the reading speed can be made fast. Also, according to the configuration of the MRAM in the second embodiment, it becomes easy to mix the plurality of MRAM macros into the system LSI. In addition, the MRAM in the second embodiment is preferable for the reduction of the area of the memory cell array because the different bit lines are not required for the writing operation and the reading operation.

Moreover, the MRAM in the second embodiment has the feature that the voltage which is applied not only to the magnetoresistive element in the selected memory cell when it is read, but also to the magnetoresistive element in the non-selected memory cell included in the same cell group 12 is also accurately given. A voltage Vns applied to one end of the magnetoresistive element in the non-selected memory cell included in the same cell group 12 is substantially equal to a voltage Vs applied to the magnetoresistive element in the selected memory cell. A difference between the voltage Vs and the voltage Vns is caused by the voltage drop resulting from the resistances of the common line 13 inside the cell group 12. However, this voltage drop is small because the wiring length of the common line 13 is short. In this way, the fact that the voltage of the non-selected memory cell can be controlled in order to suppress the wraparound current in the MRAM in the second embodiment is important in improving the reliability of the reading.

Moreover, in the MRAM in the second embodiment, the cell array area can be decreased as compared with the MRAM in the first embodiment. This is because the ratio of the number of the transistors to the number of the magnetoresistive elements is reduced.

Incidentally, the Y-selector 4 may be configured such that the selected first bit line SBL1 is connected to the second terminal 8b of the feedback type voltage control circuit 8, and the selected second bit line SBL2 is connected to the first terminal 8a of the feedback type voltage control circuit 8.

Third Embodiment

Figure 15:
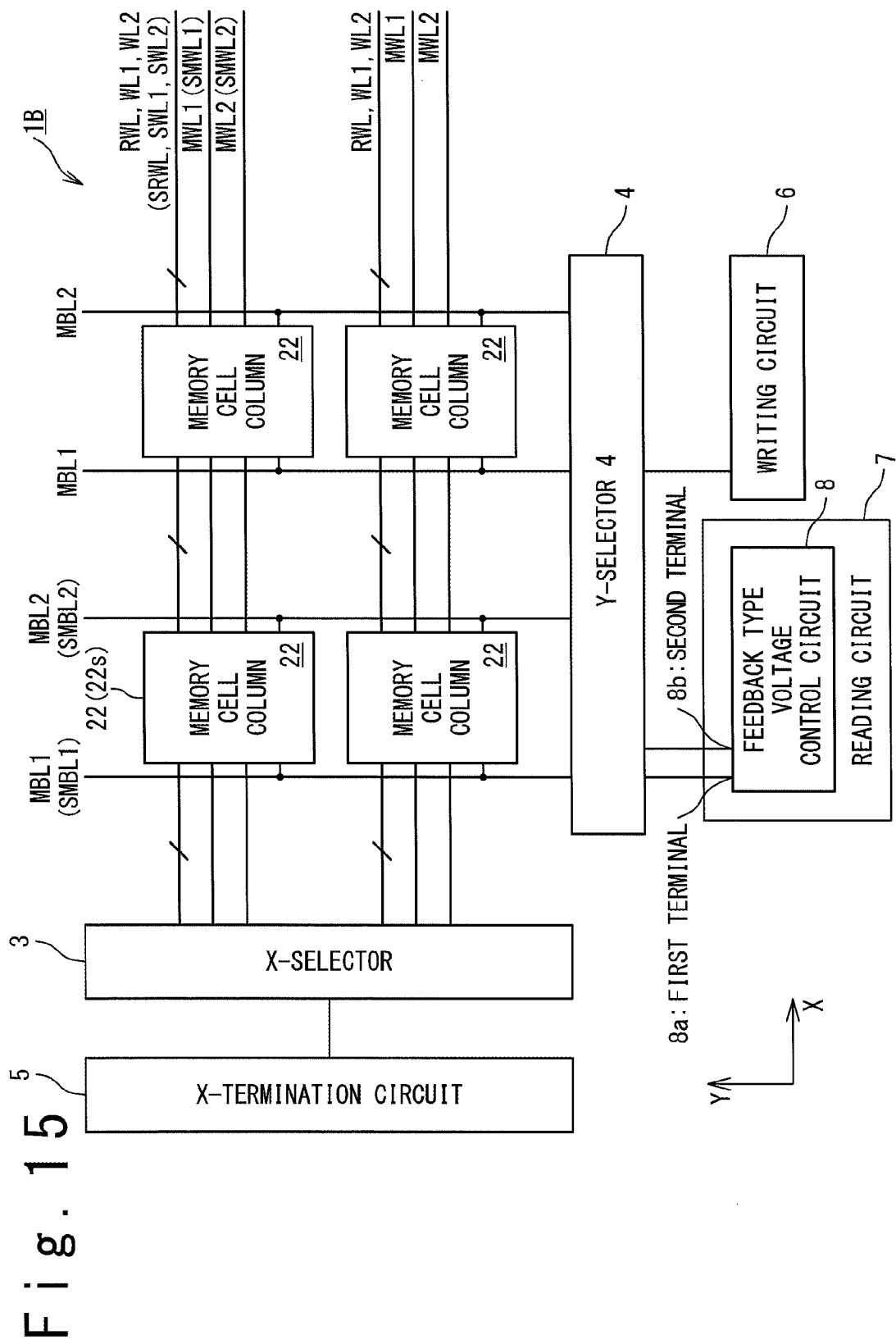
FIG. 15 is a block diagram schematically showing a configuration of a MRAM in a third embodiment.

FIG. 15 is a block diagram schematically showing a configuration of the MRAM in the third embodiment of the present invention. The configuration of the MRAM in the third embodiment is similar to the configurations of the MRAMs in the first embodiment and the second embodiment. The large difference lies in a fact that the bit lines are hierarchized in the MRAM in the third embodiment.

Figure 16A:
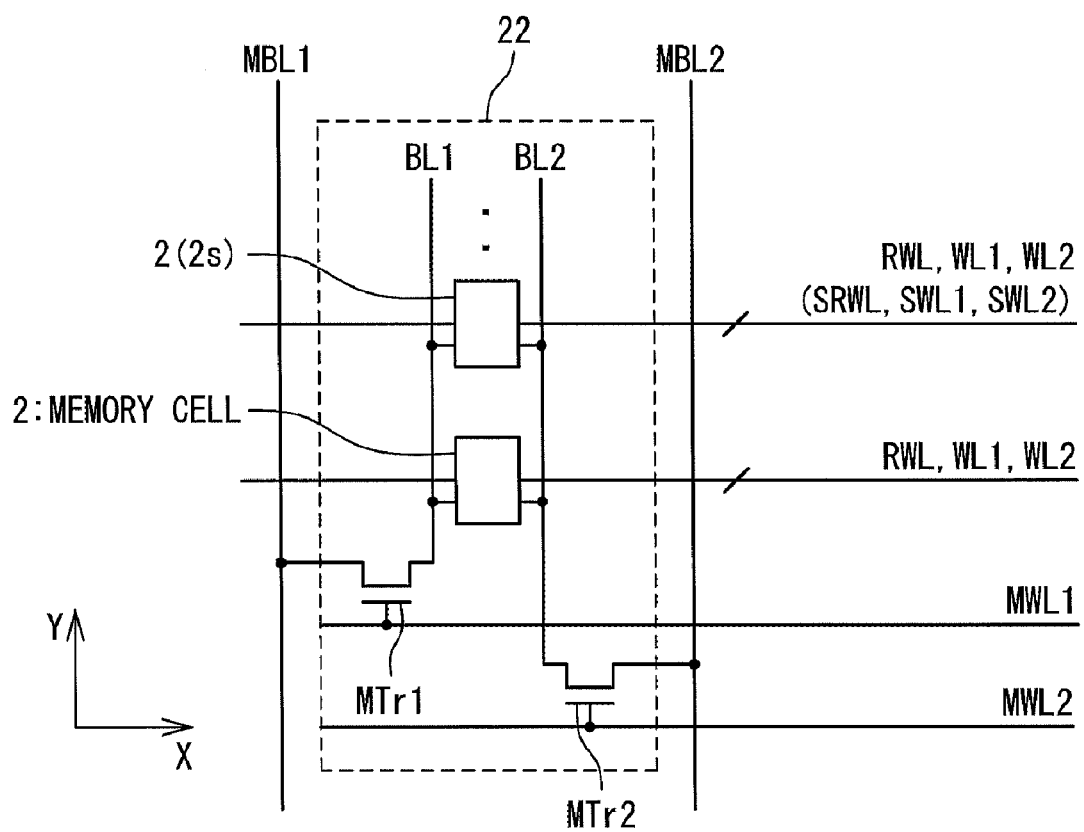
FIG. 16A is a block diagram showing a configuration of a memory cell column in the third embodiment.

In detail, in the MRAM in the third embodiment, memory cell columns 22 in which a plurality of memory cells are arranged in a line are arranged as a matrix in a memory cell array 1B, and a first main bit line MBL1 and a second main bit line MBL2 are provided along the column of the memory cell columns 22. In detail, as shown in FIG. 16A, in each memory cell column 22, the memory cells 2 are arranged in a line, and the first bit line BL1 and the second bit line BL2 are arranged along the column of the memory cells 2. The number of the memory cells 2 included in one memory cell column 22 can be properly selected. The first bit line BL1 is connected through a first main transistor MTr1 to the first main bit line MBL1, and the second bit line BL2 is connected through a second main transistor MTr2 to the second main bit line MBL2. Gates of the first main transistor MTr1 and the second main transistor MTr2 are connected to a first main word line MWL1 and a second main word line MWL2, respectively. In addition, the first word line WL1, the second word line WL2 and the reading word line RWL are provided for each of the memory cells 2. In this embodiment, the configuration of each memory cell 2 is equal to the configuration shown in FIG. 3.

Again in FIG. 15, the first main word line MWL1 and the second main word line MWL2 are connected to the X-selector 3, and the first main bit line MBL1 and the second main bit line MBL2 are connected to the Y-selector 4. The X-selector 3 selects the desirable first main word line MWL1, second main word line MWL2, first word line WL1, second word line WL2 and reading word line RWL. The Y-selector 4 selects the desirable first main bit line MBL1 and second main bit line MBL2.

Figure 16B:
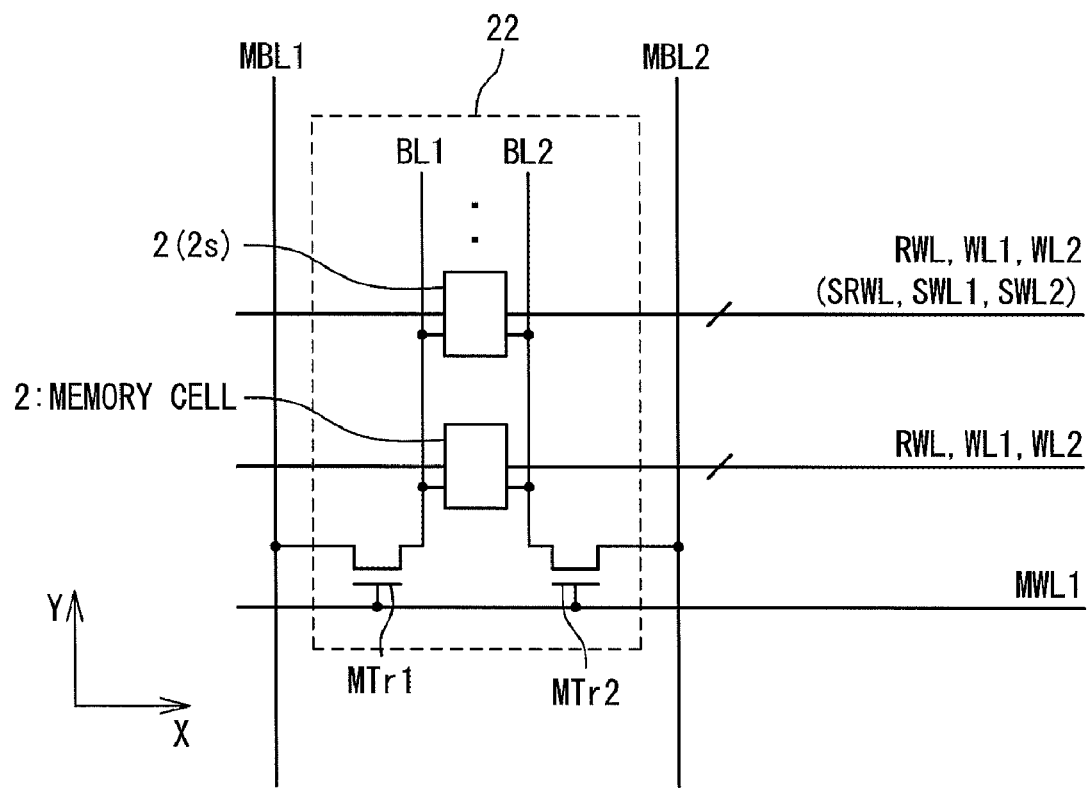
FIG. 16B is a block diagram showing another configuration of a memory cell column in the third embodiment.

Incidentally, as shown in FIG. 16B, the second main word line MWL2 may not be provided, and the gates of the first main transistor MTr1 and the second main transistor MTr2 may be commonly connected to the first main word line MWL1.

The reading operation will be described below. With reference to FIG. 15 and FIG. 16A, in the following description, the first main word line MWL1 selected by the X-selector 3 is referred to as a selected first main word line SMWL1, and the second main word line MWL2 selected by the X-selector 3 is referred to as a selected second main word line SMWL2. The memory cell 2 of the access target is hereinafter referred to as the selected memory cell 2s. Among the memory cell columns 22, the memory cell column 22 including the selected memory cell 2s is hereinafter referred to as a selected memory cell column 22s. The first main bit line MBL1 and the second main bit line MBL2, which are connected to the selected memory cell column 22s, are referred to as a selected first main bit line SMBL1 and a selected second main bit line SMBL2, respectively.

The X-selector 3 pulls up the selected first main word line SMWL1 and the selected second main word line SMWL2 to the power source level Vdd. Consequently, the first main transistor MTr1 connected to the selected first main word line SMWL1 and the second main transistor MTr2 connected to the selected second main word line SMWL2 are turned on. With such operations, the selected first main bit line SMBL1 is electrically connected to the first bit line BL1 in the selected memory cell column 22s, and the selected second main bit line SMBL2 is electrically connected to the second bit line BL2 in the selected memory cell column 22s.

In addition, the X-selector 3 pulls up the selected first word line SWL1 and the selected second word line SWL2 to the power source level Vdd, and connects the selected reading word line SRWL, which is connected to the selected memory cell 2s, to the ground. On the other hand, the first word lines WL1 and the second word lines WL2 except the selected first word line SWL1 and the selected second word line SWL2 are grounded, and the reading word lines RWL except the selected reading word line SRWL is set to the floating state or grounded.

The Y-selector 4 connects the selected first main bit line SMBL1 to the first terminal 8a of the feedback type voltage control circuit 8 and connects the selected second main bit line SMBL2 to the second terminal 8b of the feedback type voltage control circuit 8.

The reading current flowing from the first terminal 8a of the feedback type voltage control circuit 8 flows through the Y-selector 4, the first main transistor MTr1 and first bit line BL1 in the selected memory cell column 22s, and the cell transistor Tr1 and magnetroresistive element R1 in the selected memory cell 2s to the selected reading word line SRWL of the ground potential. Since the reading current flows, the voltage applied to the magnetroresistive element R1 is supplied through the cell transistor Tr2 in the selected memory cell 2s, the second bit line BL2 and second main transistor MTr2 in the selected memory cell column 22s, the selected second main bit line SMBL2 and the Y-selector 4 to the second terminal 8b of the feedback type voltage control circuit 8. Since an input impedance of the second terminal 8b is high, in the steady state, the current does not flow through the second bit line BL2 and selected second main bit line in the selected memory cell column 22s. For this reason, the influence of the voltage drop caused by the resistances of the second bit line BL2 and the second main bit line MBL2 is hardly included in the voltage supplied to the second terminal 8b. Similarly, the influence of the voltage drops in the cell transistor Tr2 and the second main transistor MTr2 and the Y-selector 4 is also small. The feedback type voltage control circuit 8 adjusts the reading current flowing from the first terminal 8a so that the difference between the voltage of the second terminal 8b and the defined reading voltage Vc is reduced. As a result, the reading circuit 7 can apply the voltage substantially equal to the defined reading voltage Vc to the magnetroresistive element R1, while suppressing the influence of the parasitic resistances to the minimum.

The MRAM in the third embodiment has the merit similar to the MRAM in the first embodiment. That is, in the MRAM in the third embodiment, the accurate application of the reading voltage enables the data to be surely read. In addition, in the MRAM in the third embodiment, the magnetroresistive element whose resistance value is low can be applied, and the reading speed can be made fast. Also, according to the configuration of the MRAM in the third embodiment, it becomes easy to mix the plurality of MRAM macros into the system LSI. In addition, the MRAM in the third embodiment is preferable for the reduction in the area of the memory cell array because the preparation for the different bit lines is not required for the writing operation and the reading operation.

In addition, in the MRAM in the third embodiment, it is possible to reduce a parasitic capacitance of the bit line connected to the feedback type voltage control circuit 8, and it is possible to improve a frequency response of the feedback type voltage control circuit 8 connected to the bit line. In the third embodiment, a parasitic capacitance of the second main bit line MBL2 at the time of the reading operation is mainly a capacitance of the cell transistor Tr2 in the selected memory cell column. In the third embodiment, the number of the memory cells 2 connected to the second main bit line MBL2 is limited, which can reduce the parasitic capacitance.

Incidentally, in the third embodiment, attention should be paid to the fact that the configurations of the memory cells 2A to 2C shown in FIGS. 5, 7, and 9 can be also employed.

Figure 17:
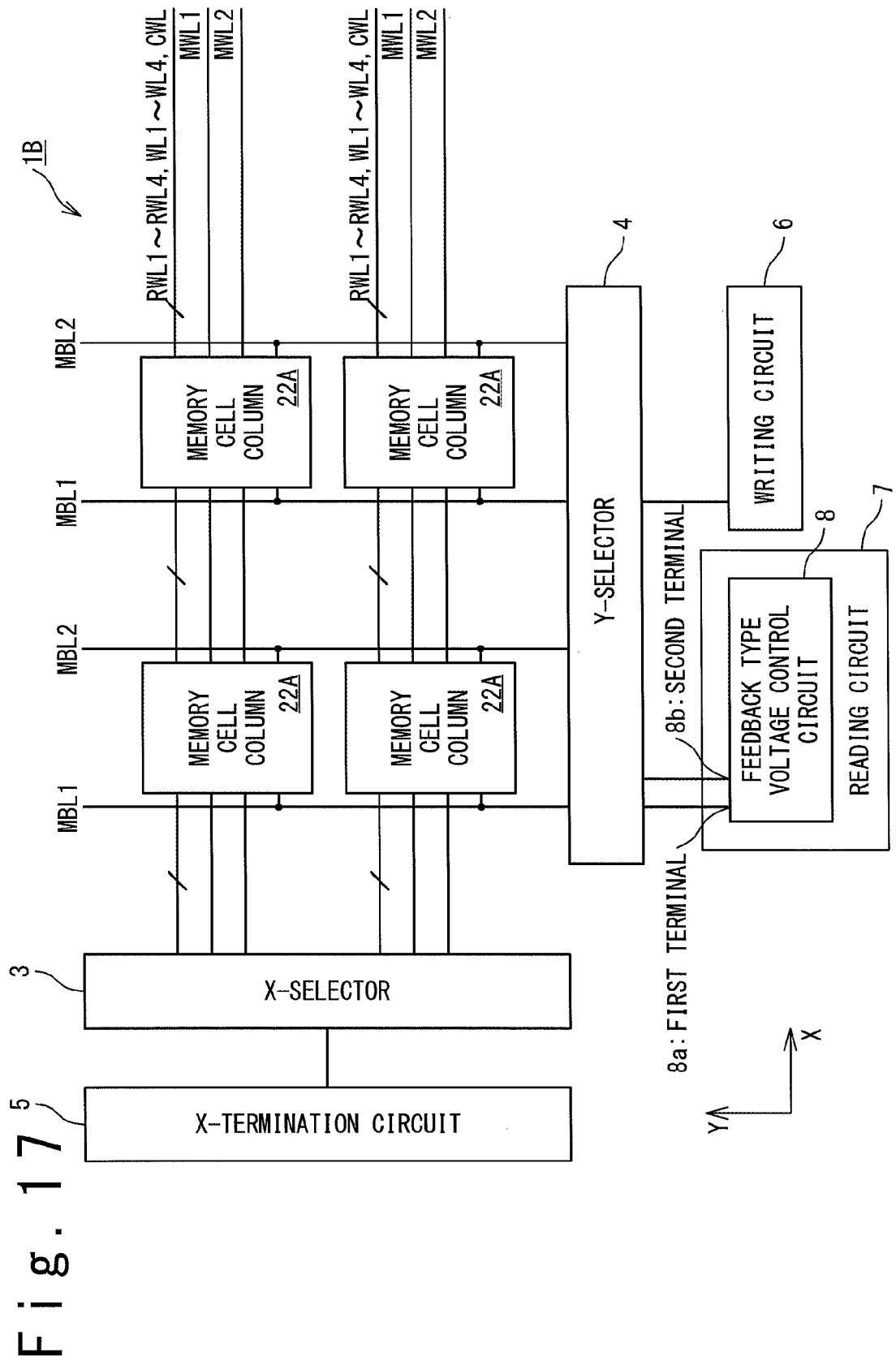
FIG. 17 is a block diagram schematically showing a configuration of a MRAM in a variation example in the third embodiment.
Figure 18:
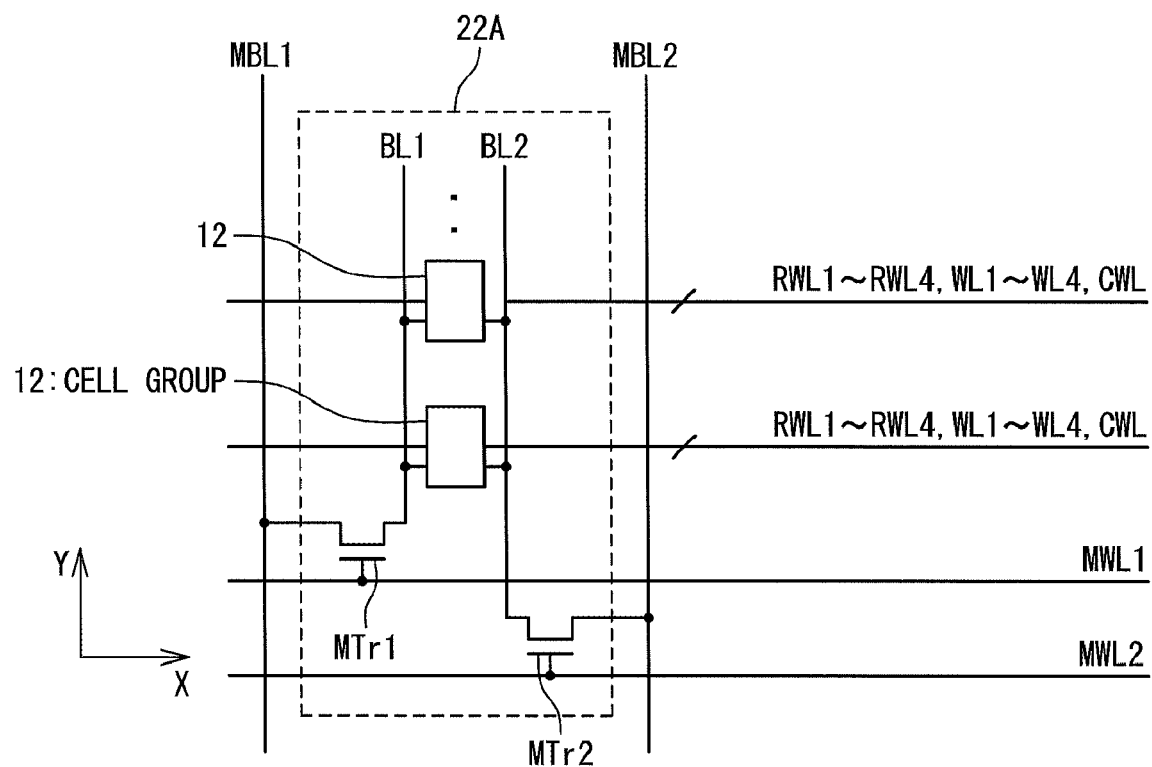
FIG. 18 is a block diagram showing a configuration of a memory cell column in the variation example in the third embodiment.

FIG. 17 is a block diagram showing a variation example in the MRAM in the third embodiment, and FIG. 18 is a circuit diagram showing a configuration of a memory cell column 22A of the MRAM in FIG. 17. In the MRAM in FIG. 17 and FIG. 18, instead of the memory cell 2, the cell groups 12 described in the second embodiment are integrated in each memory cell column 22A. Even in such configuration, the present invention can be embodied.

Fourth Embodiment

Figure 19:
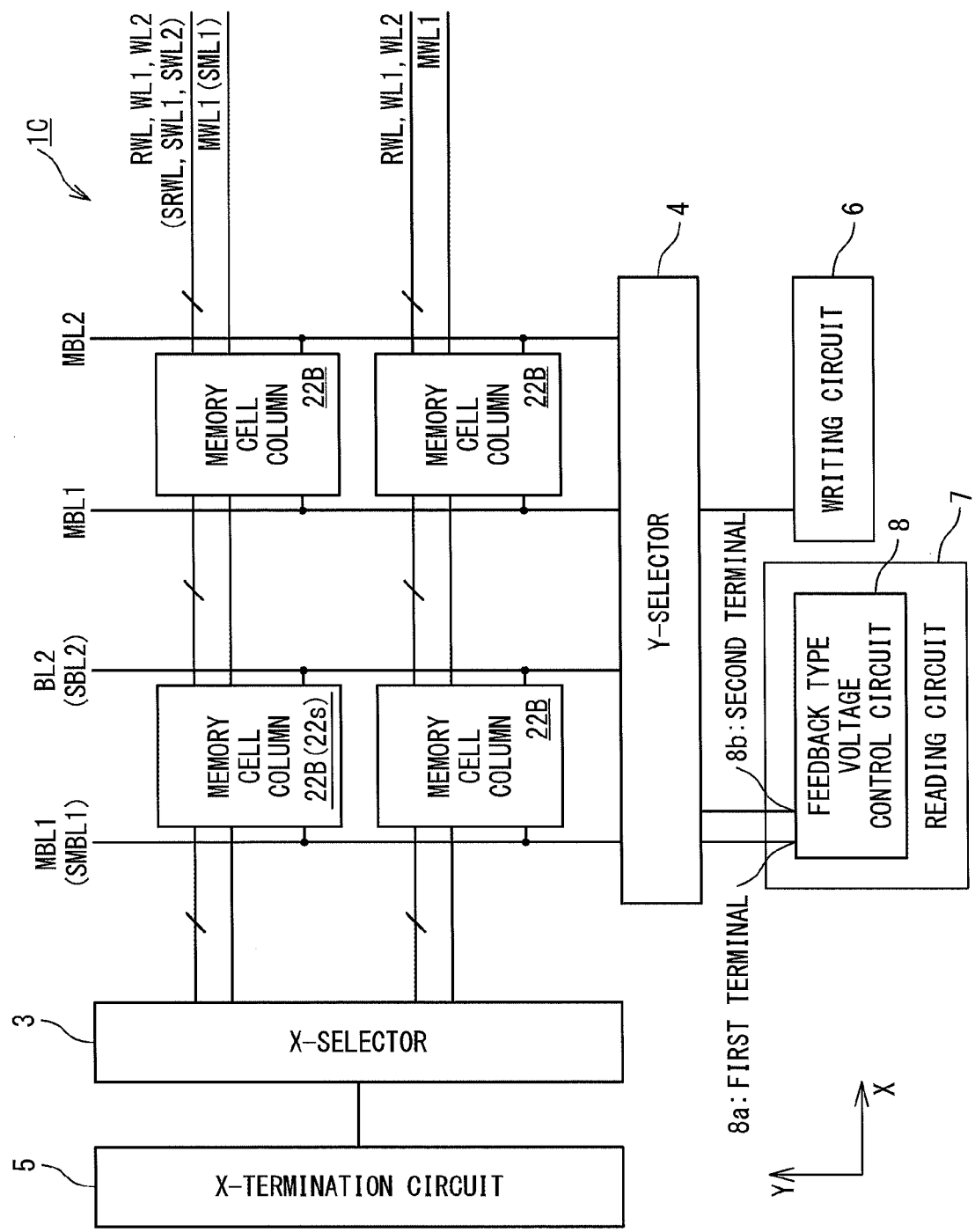
FIG. 19 is a block diagram schematically showing a configuration of a MRAM in a fourth embodiment.
Figure 20:
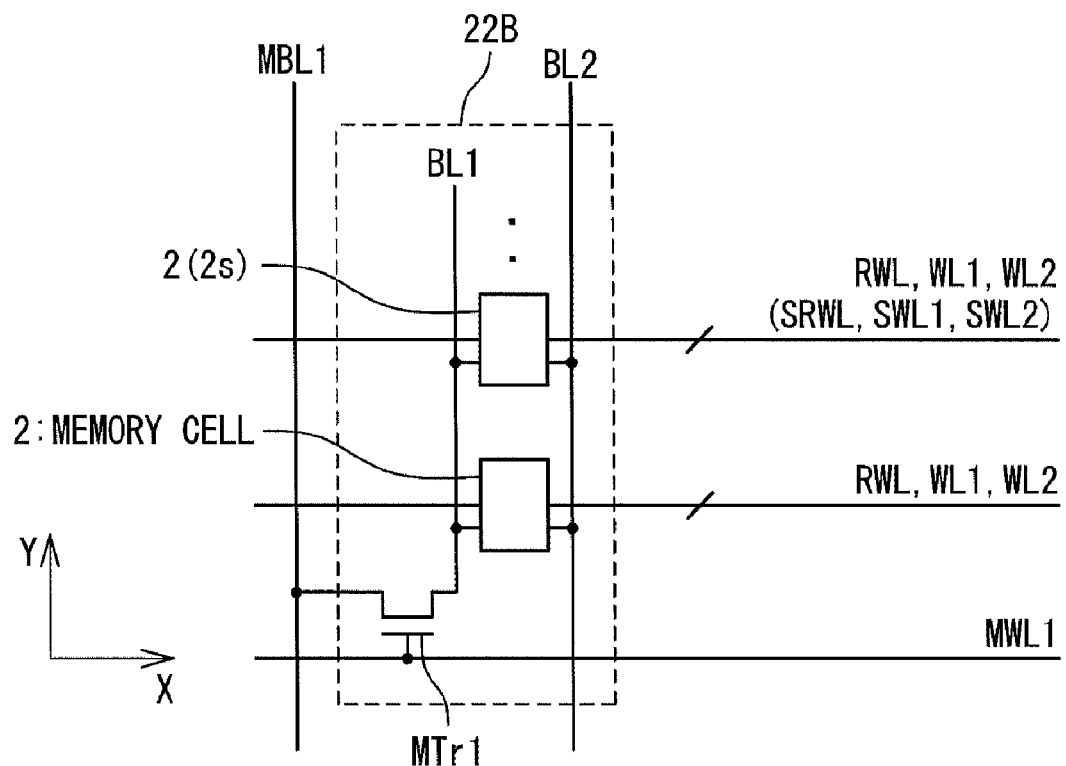
FIG. 20 is a block diagram showing a configuration of a memory cell column in the fourth embodiment.

FIG. 19 is a block diagram schematically showing a configuration of the MRAM in the fourth embodiment of the present invention, and FIG. 20 is a block diagram showing a configuration of memory cell columns 22B that are integrated in the MRAM in the fourth embodiment. The configuration of the MRAM in the fourth embodiment includes the configuration similar to the MRAM in the third embodiment. The difference lies in a fact that in the MRAM in the fourth embodiment, although the first bit line BL1 and first main bit line MBL1 in each memory cell column 22B are hierarchized, the second bit line BL2 is not hierarchized.

In detail, as shown in FIG. 19, the memory cell columns 22B are arranged as a matrix in a memory cell array 10. The first main bit line MBL1 and the second bit line BL2 are arranged along the column of the memory cell columns 22B. Attention should be paid to a fact that the second bit line BL2 is connected commonly to the memory cell columns 22B of one column. As shown in FIG. 20, each memory cell column 22B includes: a plurality of memory cells 2 arranged in a line in the Y-axis direction; the first bit line BL1; and the first main transistor MTr1. The first bit line BL1 is connected through the first main transistor MTr1 to the first main bit line MBL1. A gate of the first main transistor MTr1 is connected to the first main word line MWL1. The configuration of each memory cell 2 is equal to the structure shown in FIG. 3.

The reading operation will be described below.

In the reading operation, the X-selector 3 pulls up the selected first main word line SMWL1, which is connected to the selected memory cell column 22s, to the power source level Vdd. Since the selected first main word line SMWL1 is pulled up, the first main transistor MTr1 connected to the selected first main word line SMWL1 is turned on. Consequently, the selected first main bit line SMBL1 is electrically connected through the first main transistor MTr1 in the selected memory cell column 22s to the first bit line BL1.

The Y-selector 4 connects the selected first main bit line SMBL1 to the first terminal 8a of the feedback type voltage control circuit 8 and connects the selected second bit line SBL2 to the second terminal 8b of the feedback type voltage control circuit 8.

The reading current flowing from the first terminal 8a of the feedback type voltage control circuit 8 flows through the Y-selector 4, the first main transistor MTr1 and first bit line BL1 in the selected memory cell column 22s, and the cell transistor Tr1 in the selected memory cell 2s and magnetoresistive element R1 to the selected reading word line SRWL of the ground potential. Since the reading current flows, the voltage applied to the magnetoresistive element R1 is supplied through the cell transistor Tr2 in the selected memory cell 2s, the second bit line BL2 corresponding to the selected memory cell column 22s, and the Y-selector 4 to the second terminal 8b of the feedback type voltage control circuit 8. Since the input impedance of the second terminal 8b is high, in the steady state, the current does not flow through the second bit line BL2. For this reason, the influence of the voltage drop caused by the resistances of the second bit line BL2 is hardly included in the voltage supplied to the second terminal 8b. Similarly, the influence of the voltage drops in the cell transistor Tr2 and the Y-selector 4 is also small. The feedback type voltage control circuit 8 adjusts the reading current flowing from the first terminal 8a so that the difference between the voltage of the second terminal 8b and the defined reading voltage Vc is reduced. As a result, the reading circuit 7 can apply the voltage substantially equal to the defined reading voltage Vc to the magnetoresistive element R1 while suppressing the influence of the parasitic resistances to the minimum.

The MRAM in the fourth embodiment has the merit similar to the MRAM in the first embodiment. That is, in the MRAM in the fourth embodiment, the accurate application of the reading voltage enables the data to be surely read. In addition, in the MRAM in the fourth embodiment, the magnetoresistive element whose resistance value is low can be applied, and the reading speed can be made fast. Also, according to the configuration of the MRAM in the fourth embodiment, it becomes easy to mix the plurality of MRAM macros into the system LSI. In addition, the MRAM in the fourth embodiment is preferable for the reduction in the area of the memory cell array because the preparation for the different bit lines is not required for the writing operation and the reading operation.

Moreover, in the MRAM in the fourth embodiment, it is possible to reduce the parasitic capacitance of the first bit line BL1, and the frequency response of the feedback type voltage control circuit 8 through the bit line is improved. In the fourth embodiment, the parasitic capacitance of the first main bit line MBL1 at the time of the reading operation is mainly the capacitance of the cell transistor Tr1 in the memory cell 2 included in the selected memory cell column 22s. In the fourth embodiment, the numbers of the memory cells 2 and the cell transistors Tr1, which are connected to the first main bit line MBL1 are limited, which can reduce the parasitic capacitance of the first main bit line MBL1.

Moreover, as compared with the third embodiment, the MRAM in the fourth embodiment has a possibility that, since second main bit line is removed, the layout of the memory cell array can be made easy and the area can be simultaneously made small.

Incidentally, even in the MRAM in the fourth embodiment, attention should be paid to the fact that the configurations of the memory cells 2A to 2C shown in FIGS. 5, 7, and 9 can be also applied.

Figure 21:
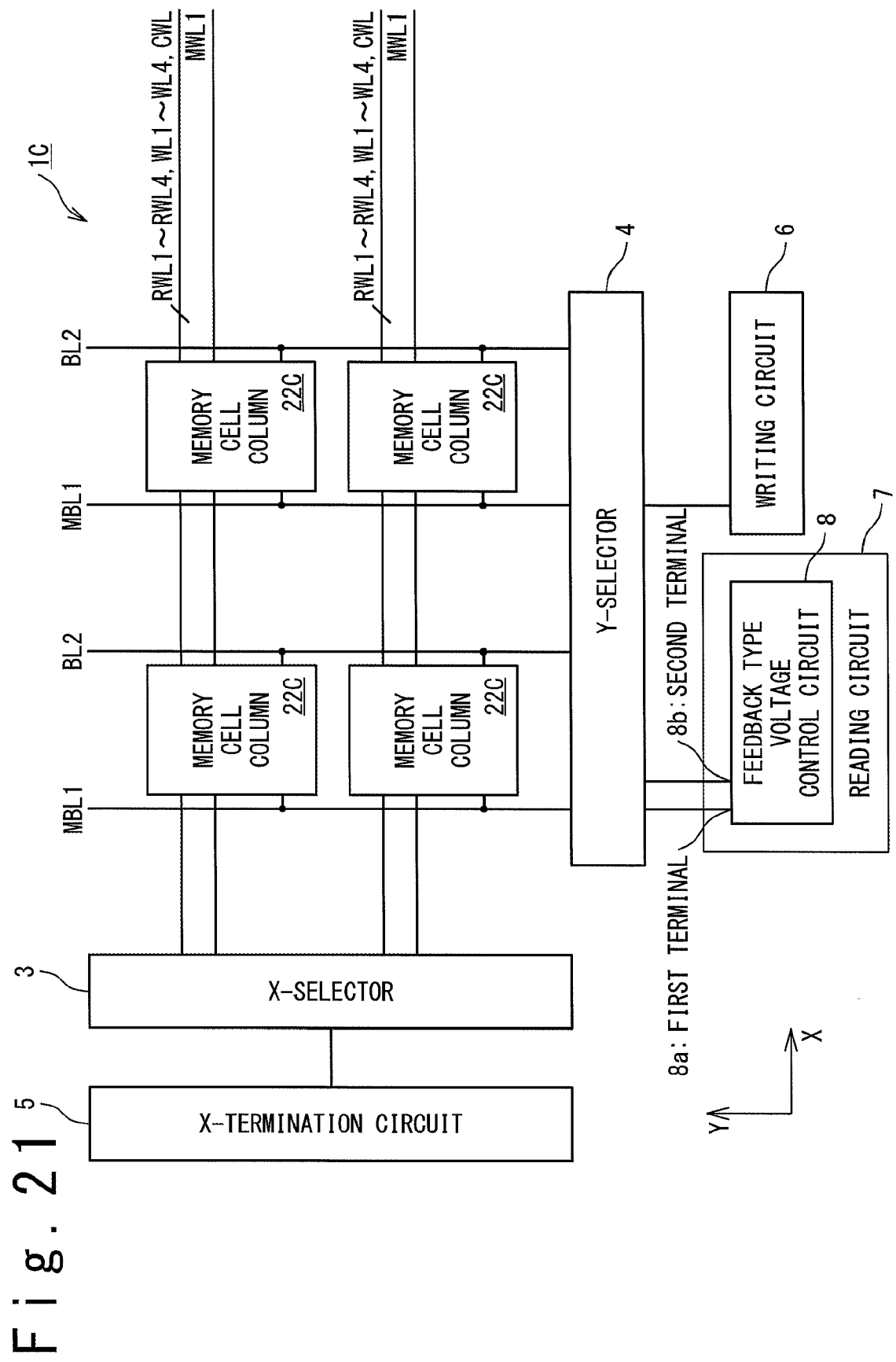
FIG. 21 is a block diagram schematically showing a configuration of a MRAM in a variation example in the fourth embodiment.
Figure 22:
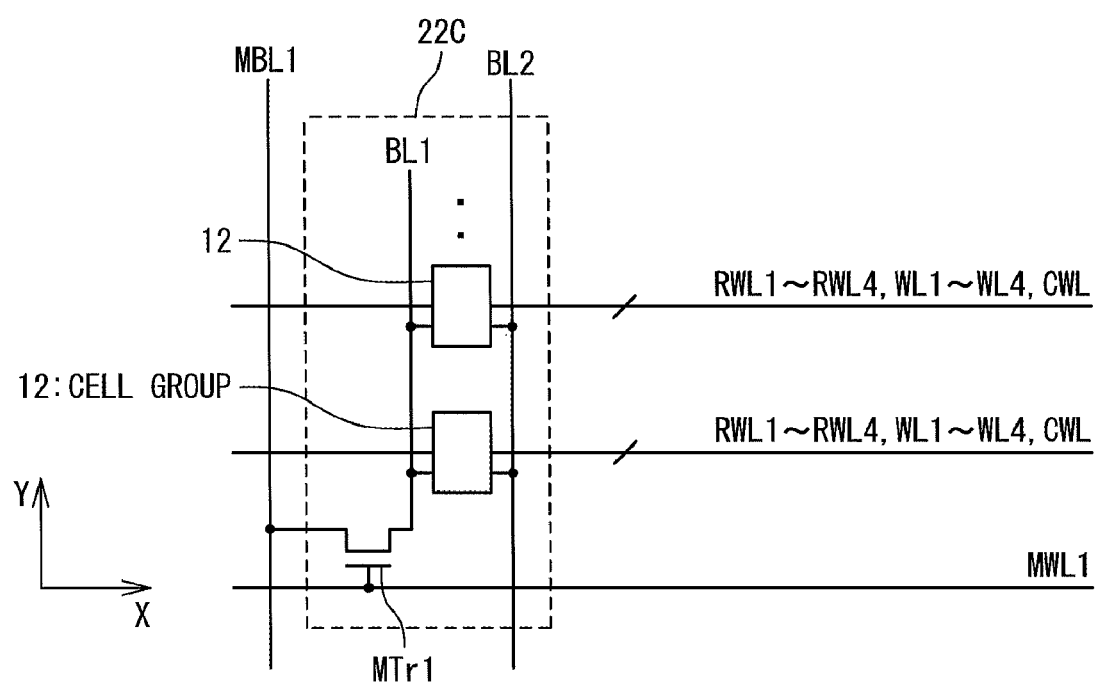
FIG. 22 is a block diagram showing a configuration of a memory cell column in the variation example in the fourth embodiment.

FIG. 21 is a block diagram showing a variation example in the MRAM in the fourth embodiment, and FIG. 22 is a circuit diagram showing a configuration of a memory cell column 22C of the MRAM in FIG. 21. In the MRAM in FIGS. 21 and 22, instead of the memory cell 2, the cell groups 12 described in the second embodiment are integrated in each memory cell column 22C. Even in such configuration, the present invention can be embodied.

Even in the MRAM shown in FIGS. 21 an 22, the cell transistors Tr1 to Tr4 whose numbers are large are connected to the first bit line BL1, and the common transistors CTr whose number is small are connected to the second bit line BL2. Thus, the parasitic capacitance can be efficiently reduced. That is, since the first bit line BL1 connected to the cell transistors Tr1 to Tr4 whose numbers are large and the first main bit line MBL1 connected to the first bit line BL1 create the hierarchy structure, the parasitic capacitance can be efficiently reduced.

Fifth Embodiment

FIG. 23A is a block diagram schematically showing a configuration of the MRAM in the fifth embodiment. The configuration of the MRAM in the fifth embodiment is similar to the configuration of the MRAM in the first embodiment. The difference lies in a fact that a bypass transistor BTr is connected between the first bit line BL1 and the second bit line BL2, which belong to the same bit line pair. One bypass transistor BTr is installed for each plurality of memory cells 2. A gate of the bypass transistor BTr is connected to a bypass word line BWL. The bypass word line BWL is connected to the X-selector 3. In the configuration of FIG. 23A, the memory cell 2 has the configuration shown in FIG. 2 in the first embodiment.

The reading operation in the fifth embodiment will be described below.

In the following description, in the bypass word line BWL, the word line selected by the X-selector 3 is referred to as a selected bypass word line SBWL.

When the reading operation is started, the X-selector 3 pulls up the selected first word line SWL1 to the power source level Vdd and turns on the cell transistor Tr1 in the selected memory cell 2s. In addition, the X-selector 3 pulls up the selected bypass word line SBWL to the power source level Vdd and turns on the bypass transistor BTr connected to the selected bypass word line SBWL. The selected reading word line SRWL is grounded. The reading word lines RWL except the selected reading word line SRWL is grounded or set to the floating state.

In this embodiment, attention should be paid to a fact that the second word line WL2 connected to the selected memory cell 2s is not selected. The second word line WL2 connected to the selected memory cell 2s is kept at the ground level Gnd, and the cell transistor Tr2 in the selected memory cell 2s is kept in the non-conductive state.

As the result of the foregoing operations, the selected first bit line SBL1 is electrically connected through the cell transistor Tr1 in the selected memory cell 2s to the magnetoresistive element R1, and the selected second bit line SBL2 is electrically connected through the bypass transistor BTr, which is connected to the selected bypass word line SBWL, to the selected first bit line SBL1.

The Y-selector 4 connects the selected first bit line SBL1 to the first terminal 8a of the feedback type voltage control circuit 8 and connects the selected second bit line SBL2 to the second terminal 8b of the feedback type voltage control circuit 8. As the result, one end of the magnetoresistive element R1 is connected through the cell transistor Tr1 in the selected memory cell 2s, the selected first bit line SBL1, the bypass transistor BTr connected to the selected bypass word line SBWL, and the selected second bit line SBL2 to the second terminal 8b of the feedback type voltage control circuit 8. The first bit lines BL1 and the second bit lines BL2, which are other than the selected first bit line SBL1 and the selected second bit line SBL2, are grounded or set to the floating state.

The reading current flowing from the first terminal 8a of the feedback type voltage control circuit 8 flows through the Y-selector 4, the selected first bit line SBL1, the cell transistor Tr in the selected memory cell 2s and the magnetoresistive element R1 to the selected reading word line SRWL of the ground potential. Since the reading current flows, the voltage applied to the magnetoresistive element R1 is supplied through the cell transistor Tr1 in the selected memory cell 2s, the selected first bit line SBL1, the bypass transistor BTr connected to the selected bypass word line SBWL, the selected second bit line SBL2 and the Y-selector 4 to the second terminal 8b of the feedback type voltage control circuit 8. Since the input impedance of the second terminal 8b is high, the current does not flow through the second bit line BL2 in the steady state. For this reason, the influence of the voltage drop caused by the resistance of the second bit line BL2 is hardly included in the voltage supplied to the second terminal 8b. Similarly, the influence of the voltage drops in the bypass transistor BTr and the Y-selector 4 is also small. The feedback type voltage control circuit 8 adjusts the reading current flowing from the first terminal 8a so that the difference between the voltage of the second terminal 8b and the defined reading voltage Vc is reduced. As a result, the reading circuit 7 can apply the voltage substantially equal to the defined reading voltage Vc to the magnetoresistive element R1 while suppressing the influence of the parasitic resistances to the minimum.

The MRAM in the fifth embodiment has the merit similar to the MRAM in the first embodiment. That is, in the MRAM in the fifth embodiment, the accurate application of the reading voltage enables the data to be surely read. In addition, in the MRAM in the fifth embodiment, the magnetoresistive element whose resistance value is low can be applied, and the reading speed can be made fast. Also, according to the configuration of the MRAM in the fifth embodiment, it becomes easy to mix the plurality of MRAM macros into the system LSI. In addition, the MRAM in the fifth embodiment is preferable for the reduction in the area of the memory cell array because the preparation for the different bit lines is not required for the writing operation and the reading operation.

In addition, the MRAM in the fifth embodiment, it is possible to select a plurality of bypass transistors BTr. Thus, as compared with the case of using only one cell transistor, the second bit line BL2 can be charged at a high speed. This is effective for suppressing the ringing of the reading voltage. Moreover, for the bypass transistor BTr in the MRAM in the fifth embodiment, it is possible to use the transistor through which the large current can be sent, as compared with the cell transistor. Hence, as compared with the case of using only one cell transistor, the second bit line BL2 can be charged at the high speed.

Incidentally, in the fifth embodiment, attention should be paid to the fact that the configurations of the memory cells 2A to 2C in FIGS. 5, 7, and 9 can be also employed.

Figure 23B:
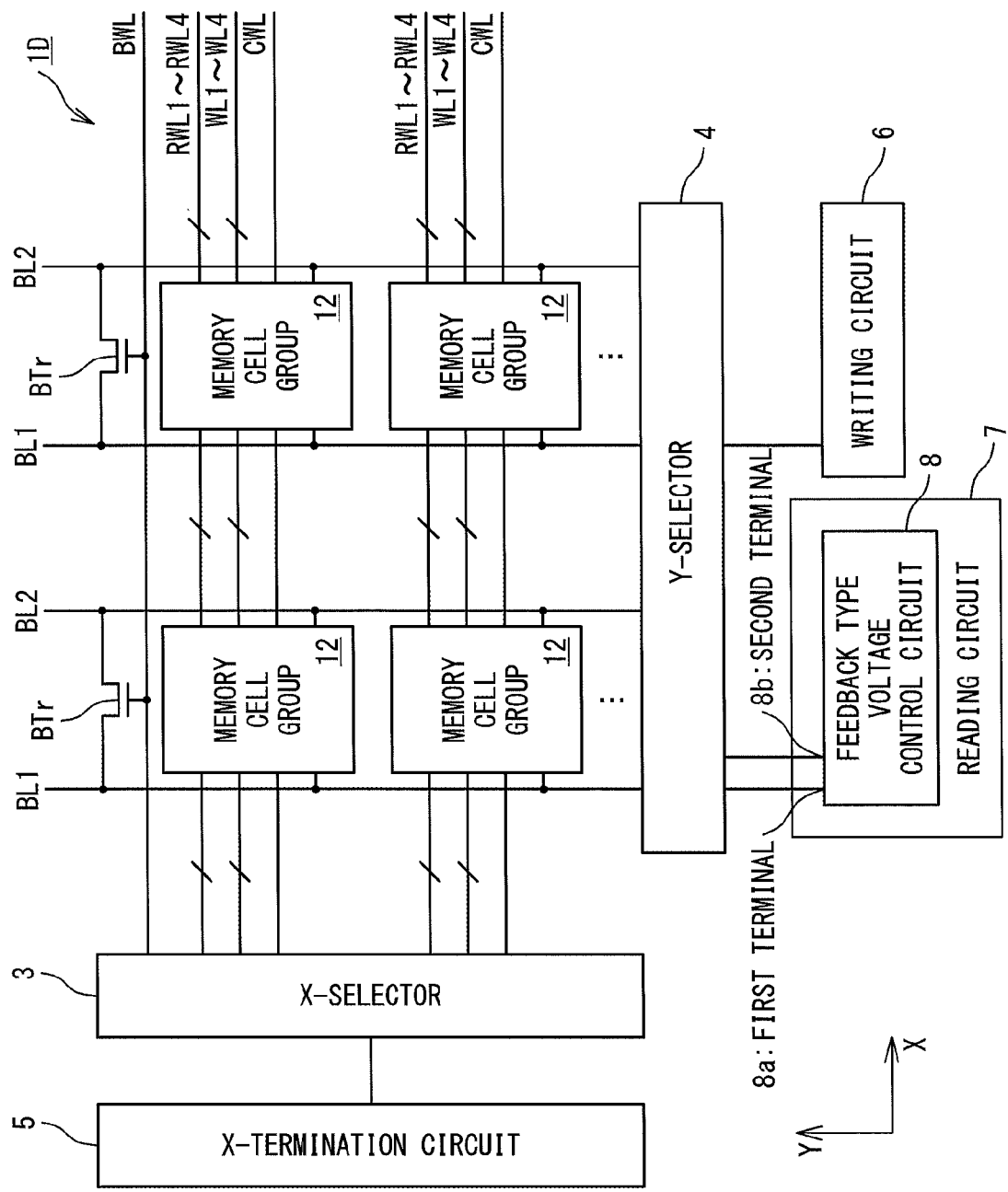
FIG. 23B is a block diagram schematically showing another configuration of a MRAM in the fifth embodiment.

Also, as shown in FIG. 23B, instead of the memory cell 2, the cell groups 12 in the second embodiment can be arranged as a matrix. In this case, one bypass transistor BTr is installed for the plurality of cell groups 12. Since the cell groups 12 are arranged, the common word lines CWL to select the row of the cell group 12 is provided in a memory cell array 1D. Moreover, the first to fourth word lines WL1 to WL4 and reading word lines RWL1 to RWL4 to select the memory cells 2 in the respective cell groups 12 are provided in the memory cell array 1D. The gate of the bypass transistor BTr is connected to the bypass word line BWL, and the bypass transistor BTr is controlled to be turned on or off through the bypass word line BWL.

(Configuration Examples of Feedback Type Voltage Control Circuit)

Configuration examples of the feedback type voltage control circuit 8 used in the first to fifth embodiments will be described below. As described below, the feedback type voltage control circuit 8 can employ various configurations other than the configuration shown in FIG. 10.

Figure 24:
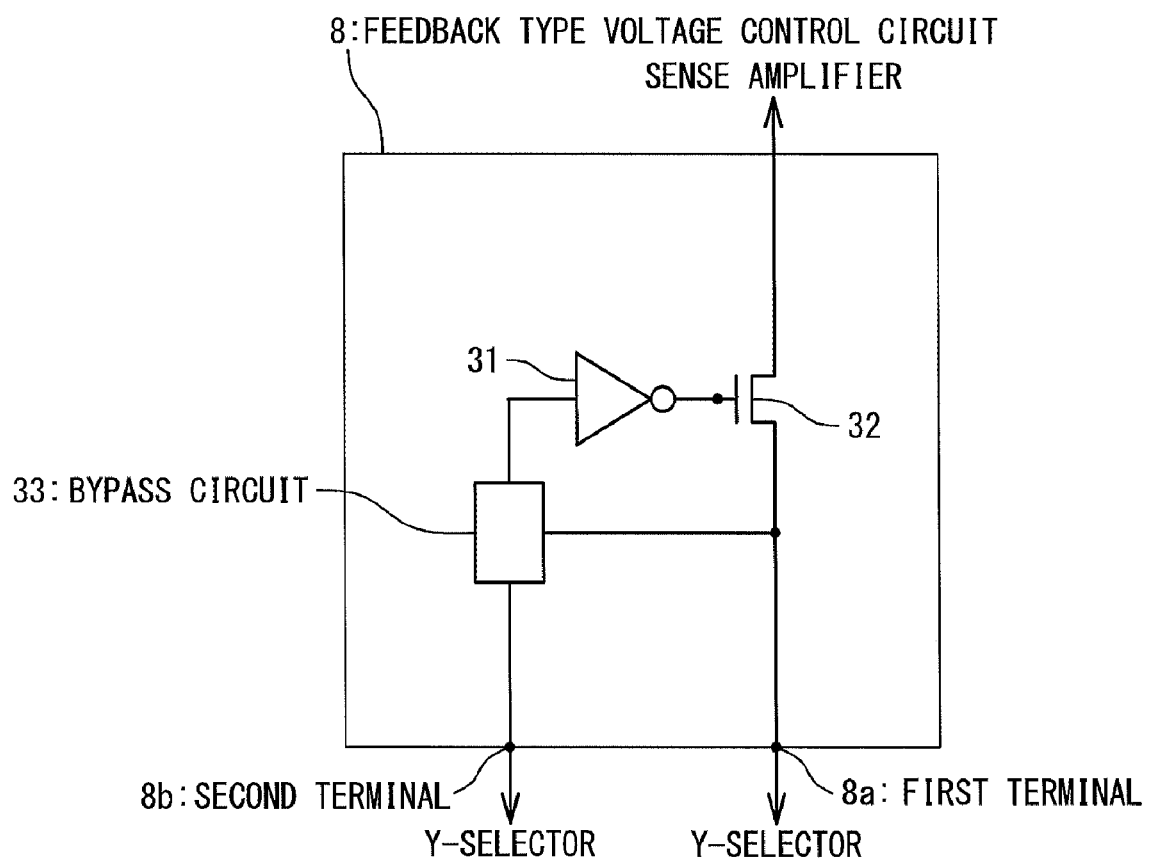
FIG. 24 is a view showing one example of a configuration of a feedback type voltage control circuit used in the first to fifth embodiments.

FIG. 24 shows a configuration example of the feedback type voltage control circuit 8 that is used in the MRAM in the present invention. In the configuration of FIG. 24, a bypass circuit 33 is added to the feedback type voltage control circuit 8 in FIG. 10. The bypass circuit 33 is connected to the first terminal 8a, the second terminal 8b and the input of the inverter 31 and has a function for feeding back the voltage of the first terminal 8a to the input of the inverter 31. With such a function, the bypass circuit 33 effectively improves the frequency response of the feedback type voltage control circuit 8.

Figure 25:
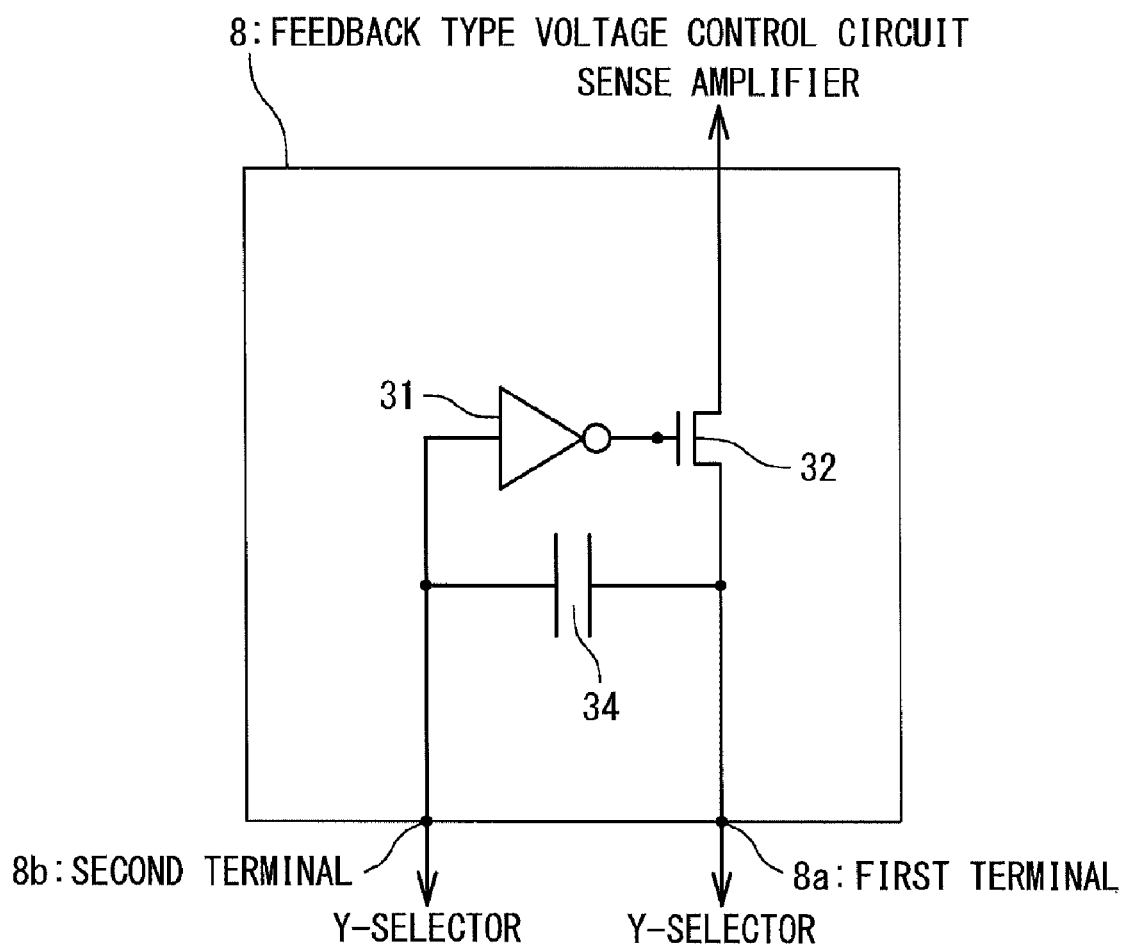
FIG. 25 is a view showing another example of a configuration of the feedback type voltage control circuit used in the first to fifth embodiments.

FIG. 25 is a configuration example in which a capacitor 34 is used as the bypass circuit 33. Since the capacitor 34 is connected between the first terminal 8a and the second terminal 8b, it is possible to effectively suppress the ringing when the first bit line BL1 (or the first main bit line MBL1) begins to be charged.

Figure 26:
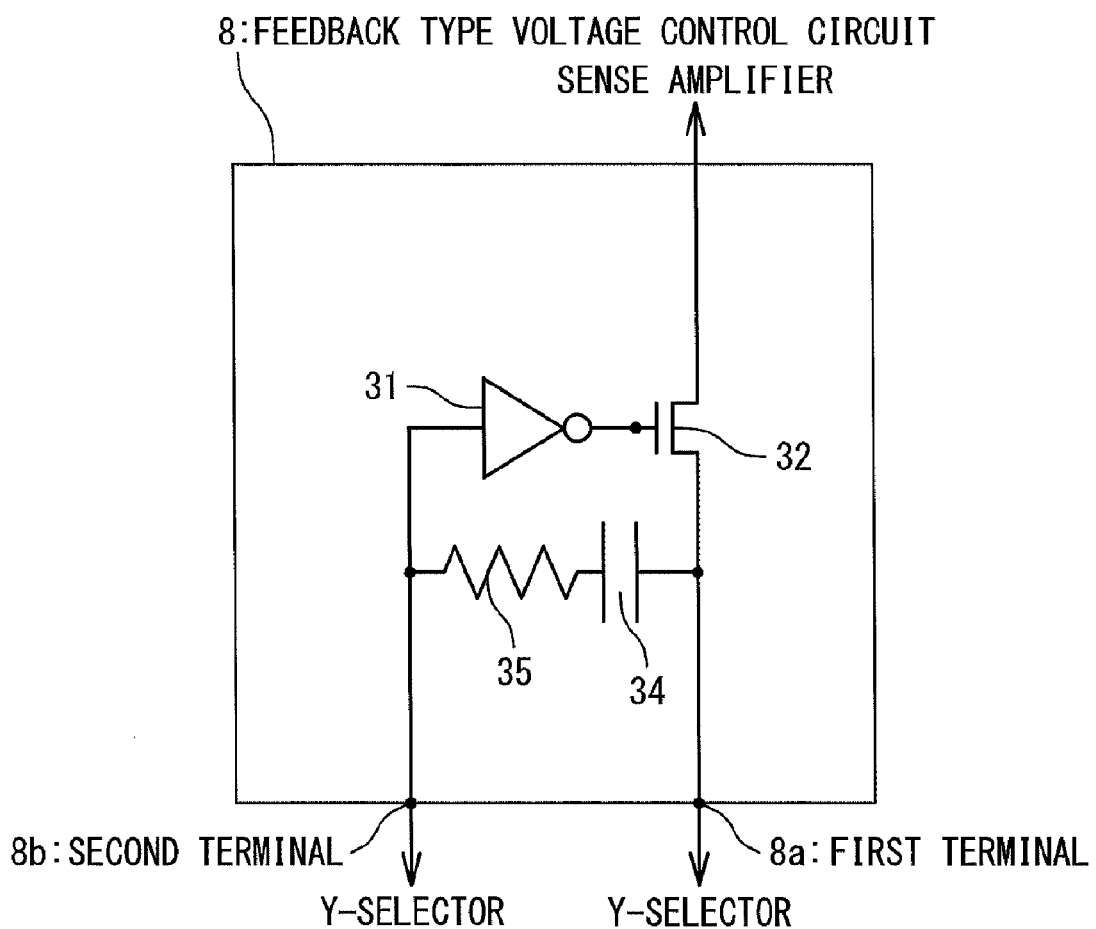
FIG. 26 is a view showing still another example of a configuration of the feedback type voltage control circuit used in the first to fifth embodiments.

FIG. 26 is a configuration example in which the capacitor 34 and a resistance element 35 that are connected in series are used as the bypass circuit 33. Since the capacitor 34 and the resistance element 35 are connected between the first terminal 8a and the second terminal 8b, it is possible to further effectively suppress the ringing when the first bit line BL1 (or the first main bit line MBL1) begins to be charged.

Figure 27:
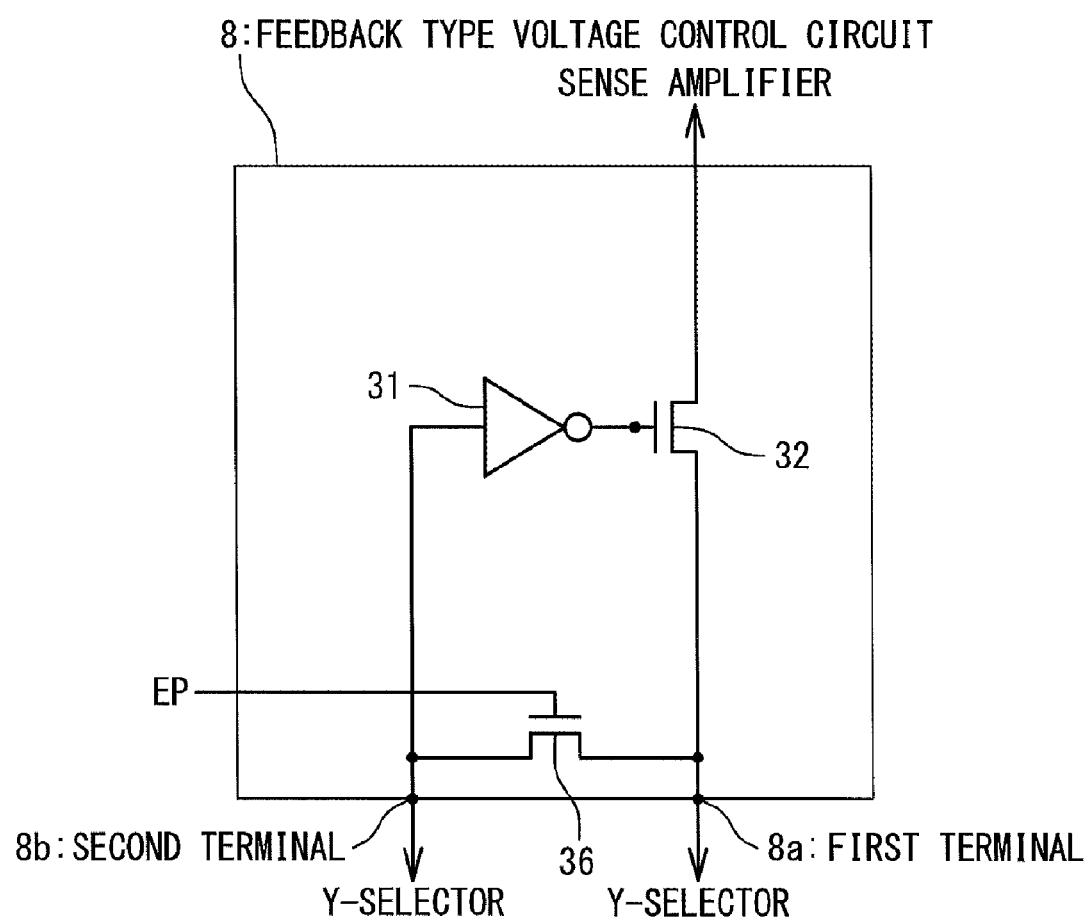
FIG. 27 is a view showing still another example of a configuration of the feedback type voltage control circuit used in the first to fifth embodiments.

FIG. 27 is a configuration example in which a bypass transistor 36 is used as the bypass circuit 33. The bypass transistor 36 is operated as following. When the first bit line BL1 (or the first main bit line MBL1) begins to be charged, the bypass transistor 36 is turned on by a control signal EP. In succession, after the sharp change in the voltage of the first bit line BL1 (or the first main bit line MBL1) is finished, the bypass transistor 36 is turned off. According to the foregoing operation, the first bit line BL1 (or the first main bit line MBL1) can be charged at a high speed, and after the bypass transistor 36 is turned off, the voltage applied to the magnetroresistive element can be accurately detected.

Figure 28:
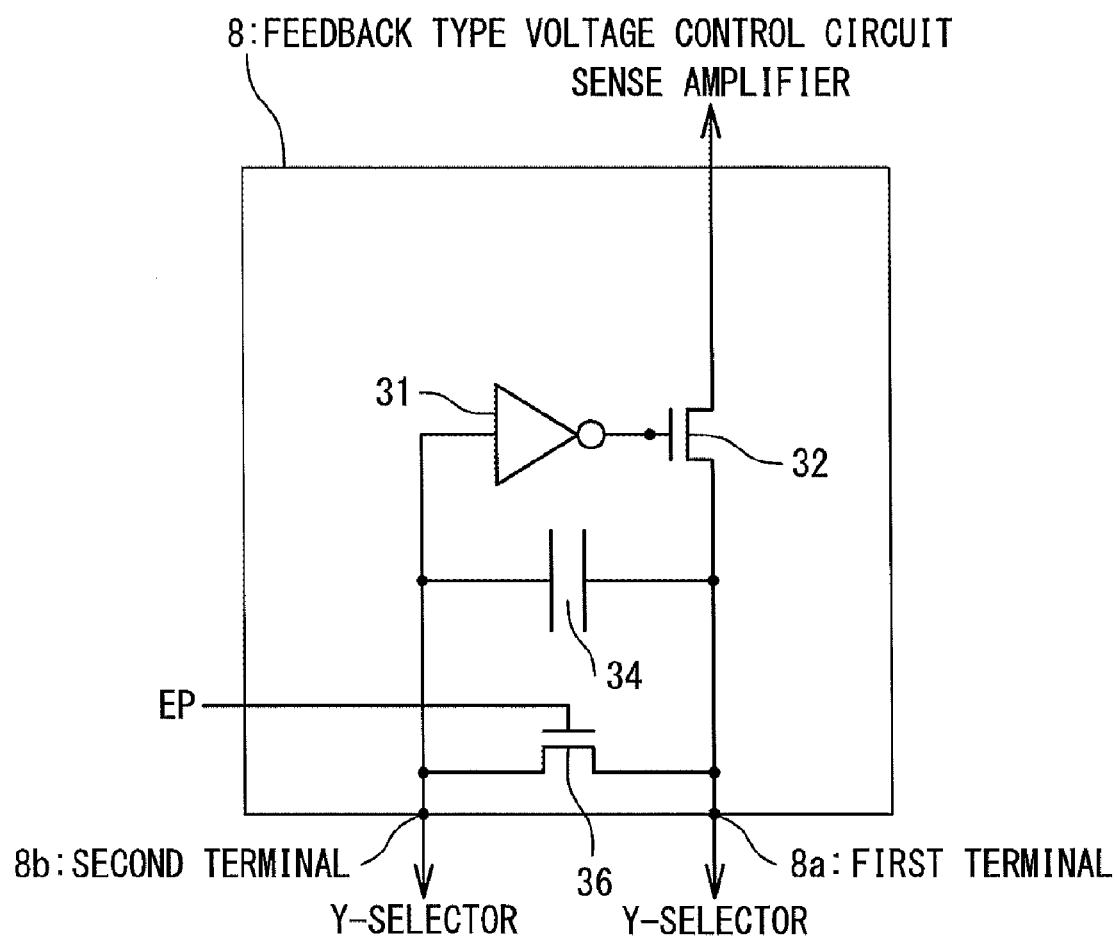
FIG. 28 is a view showing still another example of a configuration of the feedback type voltage control circuit used in the first to fifth embodiments.

FIG. 28 is a configuration example in which the capacitor 34 and the bypass transistor 36 that are connected in parallel are used as the bypass circuit 33. According to the configuration of FIG. 28, the ringing can be further effectively suppressed, as compared with the configuration in FIG. 27 in which only the bypass transistor 36 is used.

Sixth Embodiment

Figure 29:
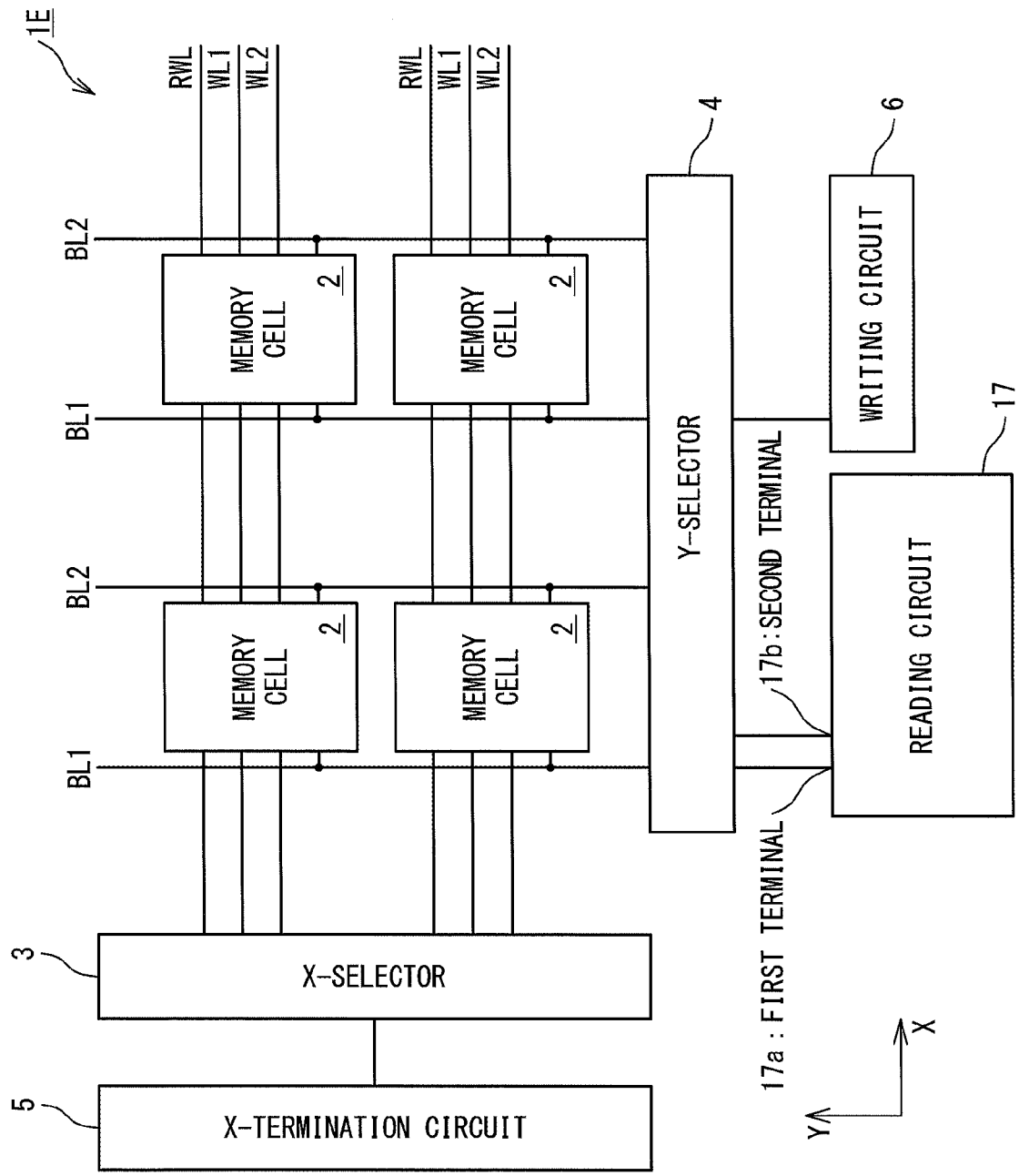
FIG. 29 is a block diagram schematically showing a configuration of a MRAM in a sixth embodiment.

FIG. 29 is a block diagram showing a configuration of the MRAM in the sixth embodiment. The configuration of the MRAM in the sixth embodiment is similar to the configuration of the MRAM in the first embodiment. The difference lies in a structure in which in the sixth embodiment, a reading circuit 17 for carrying out an operation that differs from the reading circuit 7 used in the MRAM in the first to fifth embodiments is used to read data. The reading circuit 17 used in the sixth embodiment has a function for outputting a certain reading current from the first terminal 8a and a function for determining the read data from the voltage supplied to the second terminal 8b (namely, the voltage of the selected second bit line BL2). Attention should be paid to the configuration that, differently from the reading circuit 17 used in this embodiment, the reading circuit 7 used in the first to fifth embodiments has the function for outputting the reading current, which is variable on the basis of the voltage inputted to the second terminal 8b, from the first terminal 8a, and determines the read data based on the value of the reading current. A configuration of a memory cell array 1E in the sixth embodiment is equal to the configuration of the memory cell array 1 in the first embodiment, and a configuration of the memory cell 2 in the sixth embodiment is equal to the configuration of the memory cell 2 in the first embodiment shown in FIG. 3.

In the reading circuit 17, attention should be paid to a configuration that a second terminal 17b has "High Impedance" for the earth. That is, as long as the usual operation is carried out, when a voltage is applied to the second terminal 17b of the reading circuit 17, the steady-state current flowing through the second terminal 17b is zero (0) (except a leakage current). As described later, the configuration that the second terminal 17b has the high impedance for the earth contributes to the improvement of the reliability of the data.

(Reading Operation)

The reading operation will be described below.

Figure 30:
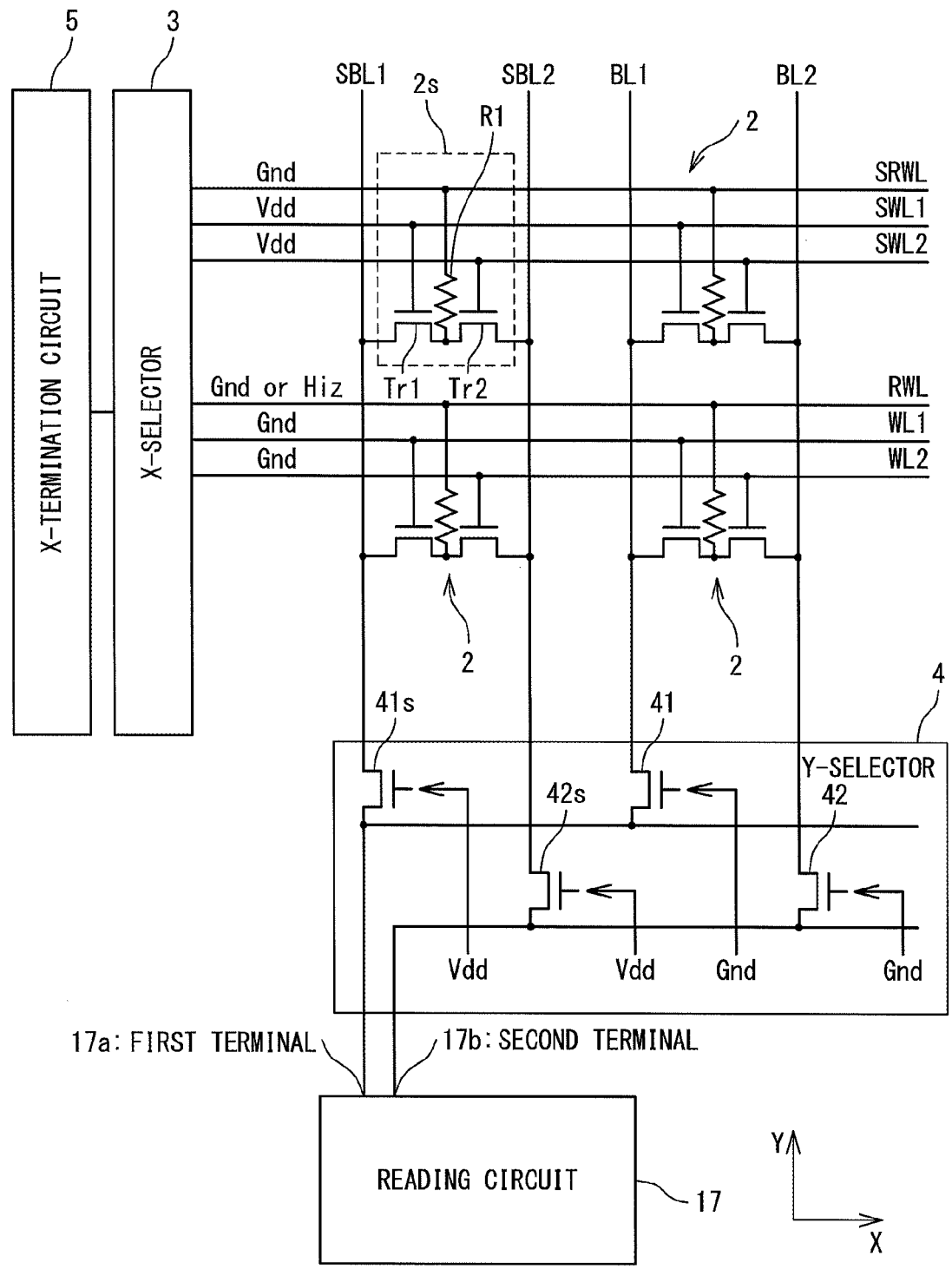
FIG. 30 is a circuit diagram describing a reading operation in the sixth embodiment.

FIG. 30 is a block diagram showing portions related to the reading from the MRAM in this embodiment.

In the reading operation, the X-selector 3 pulls up the selected first word line SWL1 and the selected second word line SWL2 to the power source level Vdd. Consequently the cell transistor Tr1 and the cell transistor Tr2 in the selected memory cell 2s are turned on. On the other hand, the selected reading word line SRWL is grounded. The reading word lines RWL except the selected reading word line SRWL is grounded or set to the floating state. In the selected memory cell 2s, the cell transistor Tr1 and the cell transistor Tr2 are turned on. Thus, the selected first bit line SBL1 and the selected second bit line SBL2 are electrically connected to the magnetroresistive element R1 in the selected memory cell 2s.

In addition, the Y-selector 4 turns on the transistor 41s connected to the selected first bit line SBL1 and the transistor 42s connected to the selected second bit line SBL2, among the transistors 41, 42. Consequently, the selected first bit line SBL1 is electrically connected to the first terminal 8a of the feedback type voltage control circuit 8, and the selected second bit line SBL2 is electrically connected to the second terminal 8b. The first bit lines BL1 except the selected first bit line SBL1 and the second bit lines BL2 except the selected second bit line SBL2 are grounded or set to the floating state.

The reading circuit 17 supplies a certain reading current from a first terminal 17a through the Y-selector 4 and the selected first bit line SBL1 to the magnetroresistive element R1 in the selected memory cell 2s. The voltage generated when the certain reading current flows through the magnetroresistive element R1 is supplied through the cell transistor Tr2 in the selected memory cell 2s, the selected second bit line SBL2 and the Y-selector 4 to a second terminal 17b. Since an input impedance of the second terminal 17b is high, the current does not flow through the second bit line in the steady state. For this reason, the influence of the voltage drop caused by the resistance of the second bit line BL2 is hardly included in the voltage inputted to the second terminal 17b. Similarly, the influence of the voltage drops in the cell transistor Tr2 in the selected memory cell and the Y-selector 4 is also small. Thus, the reading circuit 17 can detect the voltage generated in the magnetroresistive element R1 from the second terminal 17b without suffering from the influence of the voltage drop. The reading circuit 17 determines data stored in the memory cell, from the detected voltage.

As described above, the MRAM in the sixth embodiment can accurately detect the voltage generated in the magnetroresistive element R1 without suffering from the influence of the parasitic resistances and surely read the data.

In addition, the MRAM in the sixth embodiment also has the merit similar to another merit of the MRAM in the first embodiment. That is, in the MRAM in the sixth embodiment, the magnetroresistive element whose resistance value is low can be applied, and the reading speed can be made fast. Also, according to the configuration of the MRAM in the sixth embodiment, it becomes easy to mix the plurality of MRAM macros into the system LSI. In addition, the MRAM in the sixth embodiment is preferable for the reduction in the area of the memory cell array because the preparation for the different bit lines is not required for the writing operation and the reading operation.

In addition, the MRAM in the sixth embodiment has a merit that, since the feedback type voltage control circuit is not used, the circuit configuration of the reading circuit 17 becomes simple.

Incidentally, also in the sixth embodiment, attention should be paid to a fact that the configuration of the memory cell 2 shown in FIGS. 5, 7, and 9 can be employed. As described in the first variation example shown in FIGS. 4, 5, the structure in which both of the cell transistors Tr1, Tr2 are connected to the first word line WL1 may be employed. Also, as described in the second variation example shown in FIGS. 6, 7, instead of the reading word line RWL, the reading bit line RBL connected to the Y-selector 4 may be used. In this case, at the time of the reading operation, the reading bit line RBL connected to the selected memory cell is grounded. Also, as described in the third variation example shown in FIGS. 8, 9, the structure in which, while the reading bit line RBL is used, both of the cell transistors Tr1, Tr2 are connected to the first word line WL1 may be employed.

This application is the National Phase of PCT/JP2008/069770, filed on Oct. 30, 2008, which is based upon and claims the benefit of priority from Japanese patent application No. 2007-290681 filed on Nov. 8, 2007, the disclosure of which is incorporated herein in its entirety by reference.

The invention claimed is:

1. A magnetic random access memory comprising:
   first and second bit lines configured to be provided to extend in a first direction;
   a storage block configured to include at least one magnetoresistive element for storing data; and
   a reading circuit configured to determine said data,
   wherein said reading circuit includes:
   a feedback type voltage control circuit configured to include a first terminal electrically connected to said first bit line and a second terminal electrically connected to said second bit line,
   wherein said second terminal has a high impedance to prevent a steady-state current from flowing into at a time of a reading operation,
   wherein said feedback type voltage control circuit supplies a reading current from said first terminal to said first bit line at the time of said reading operation,
   wherein said storage block is configured such that said reading current flows from said first bit line to said magnetoresistive element and said magnetoresistive element is connected to said second bit line at the time of said reading operation, and
   wherein said feedback type voltage control circuit controls said reading current on the basis of a voltage supplied to said second terminal through the second bit line.

2. The magnetic random access memory according to claim 1, further comprising:
   a reading word line configured to be provided to extend in a second direction perpendicular to said first direction,
   wherein said storage block includes:
   a memory cell configured to include said magnetoresistive element, a first cell transistor, and a second cell transistor,
   wherein said first cell transistor is connected between one end of said magnetoresistive element and said first bit line,
   wherein said second cell transistor is connected between said one end of said magnetoresistive element and said second bit line, and
   wherein the other end of said magnetoresistive element is connected to said reading word line.

3. The magnetic random access memory according to claim 2, further comprising:
   first and second word lines configured to be provided to extend in said second direction,
   wherein a gate of said first cell transistor is connected to said first word line, and
   wherein a gate of said second cell transistor is connected to said second word line.

4. The magnetic random access memory according to claim 2, further comprising:
   a first word line configured to be provided to extend in said second direction,
   wherein a gate of said first cell transistor and a gate of said second cell transistor are connected to said first word line.

5. The magnetic random access memory according to claim 2, further comprising:
   a reading bit line configured to be provided to extend in said first direction, said reading word line being replaced by said reading bit line,
   wherein said the other end of said magnetoresistive element is connected to said reading bit line.

6. The magnetic random access memory according to claim 1, further comprising:
   a plurality of reading word lines,
   wherein said at least one magnetoresistive element includes a plurality of magnetoresistive elements,
   wherein said storage block includes:
   a plurality of memory cells,
   a common line, and
   a common transistor,
   wherein each of said plurality of memory cells includes:
   one of said plurality of magnetoresistive elements, and
   a cell transistor connected between one end of said one magnetoresistive element and said first bit line,
   wherein said one end of said one magnetoresistive element of each of said plurality of memory cells is connected to said common line,
   wherein the other end of said one magnetoresistive element of each of said plurality of memory cells is connected to one of said plurality of reading word lines, and
   wherein said common transistor is connected between said common line and said second bit line.

7. The magnetic random access memory according to claim 1, further comprising:
   first and second main bit lines configured to be provided to extend in said first direction;
   a first main transistor configured to be connected between said first bit line and said first main bit line;
   a second main transistor configured to be connected between said second bit line and said second main bit line; and
   a reading word line configured to be provided to extend in a second direction perpendicular to said first direction,
   wherein said storage block includes:
   a memory cell configured to include said magnetoresistive element, a first cell transistor, and a second cell transistor,
   wherein said first cell transistor is connected between one end of said magnetoresistive element and said first bit line,
   wherein said second cell transistor is connected between said one end of said magnetoresistive element and said second bit line, and
   wherein the other end of said magnetoresistive element is connected to said reading word line.

8. The magnetic random access memory according to claim 1, further comprising:
   first and second main bit lines configured to be provided to extend in said first direction;
   plurality of reading word lines configured to be provided to extend in a second direction perpendicular to said first direction,
   wherein said at least one magnetoresistive element includes a plurality of magnetoresistive elements,
   wherein said storage block includes:
   a plurality of memory cells, a common line, and a common transistor, wherein each of said plurality of memory cells includes:

one of said plurality of magnetoresistive elements, and a cell transistor connected between one end of said one magnetoresistive element and said first bit line, wherein said one end of said one magnetoresistive element of each of said plurality of memory cells is connected to said common line, wherein the other end of said one magnetoresistive element of each of said plurality of memory cells is connected to one of said plurality of reading word lines, and wherein said common transistor is connected between said common line and said second bit line.

9. The magnetic random access memory according to claim 1, further comprising:

a first main bit line configured to be provided to extend in said first direction;

a first main transistor configured to be connected between said first bit line and said first main bit line; and a reading word line configured to be provided to extend in a second direction perpendicular to said first direction, wherein said storage block includes:

a memory cell configured to include said magnetoresistive element, a first cell transistor, and a second cell transistor, wherein said first cell transistor is connected between one end of said magnetoresistive element and said first bit line, wherein said second cell transistor is connected between said one end of said magnetoresistive element and said second bit line, and wherein the other end of said magnetoresistive element is connected to said reading word line.

10. The magnetic random access memory according to claim 1, further comprising:

a first main bit line configured to be provided to extend in said first direction;

a first main transistor configured to be connected between said first bit line and said first main bit line; and a plurality of reading word lines configured to be provided to extend in a second direction perpendicular to said first direction, wherein said at least one magnetoresistive element includes a plurality of magnetoresistive elements, wherein said storage block includes:

a plurality of memory cells, a common line, and a common transistor, wherein each of said plurality of memory cells includes:

one of said plurality of magnetoresistive elements, and a cell transistor connected between one end of said one magnetoresistive element and said first bit line, wherein said one end of said one magnetoresistive element of each of said plurality of memory cells is connected to said common line, wherein the other end of said one magnetoresistive element of each of said plurality of memory cells is connected to one of said plurality of reading word lines, and wherein said common transistor is connected between said common line and said second bit line.

11. The magnetic random access memory according to claim 2, further comprising:

a bypass transistor configured to be provided between said first bit line and said second bit line to electrically connect said first bet line and said second bit line.

12. The magnetic random access memory according to claim 1, wherein said feedback type voltage control circuit is configured to control said reading current such that a difference between said voltage supplied to said second terminal and a defined reading voltage becomes small.

13. The magnetic random access memory according to claim 12, wherein said feedback type voltage control circuit includes:

a CMOS inverter configured to be connected to said second terminal at an input, and a NMOS transistor configured to include a gate connected to an output of said CMOS inverter, and a source connected to said first terminal.

14. The magnetic random access memory according to claim 13, further comprising:

a bypass circuit configured to electrically connect said first terminal and said input of said CMOS inverter.

15. The magnetic random access memory according to claim 14, wherein said bypass circuit includes:

a capacitor configured to be connected between said first terminal and said second terminal.

16. The magnetic random access memory according to claim 15, wherein said bypass circuit further includes:

a resistor element configured to be connected to said capacitor in series between said first terminal and said second terminal.

17. The magnetic random access memory according to claim 15, wherein said bypass circuit further includes:

a transistor configured to be connected to said capacitor in parallel between said first terminal and said second terminal.

18. A magnetic random access memory comprising:

first and second bit lines configured to be provided to extend in a first direction;

a storage block configured to include at least one magnetoresistive element for storing data; and a reading circuit, wherein said reading circuit includes a first terminal electrically connected to said first bit line and a second terminal electrically connected to said second bit line, wherein said second terminal has a high impedance to prevent a steady-state current from flowing into at a time of a reading operation, wherein said reading circuit supplies a constant reading current from said first terminal to said first bit line at the time of said reading operation, wherein said storage block is configured such that said reading current flows from said first bit line to said magnetoresistive element and said magnetoresistive element is connected to said second bit line at the time of said reading operation, and wherein said reading circuit determines said data on the basis of a voltage supplied to said second terminal through said second bit line.

19. The magnetic random access memory according to claim 18, further comprising:

a reading word line configured to be provided to extend in a second direction perpendicular to said first direction, wherein said storage block includes:

a memory cell configured to include said magnetoresistive element, a first cell transistor, and a second cell transistor, wherein said first cell transistor is connected between one end of said magnetoresistive element and said first bit line, wherein said second cell transistor is connected between said one end of said magnetroresistive element and said second bit line, and wherein the other end of said magnetroresistive element is connected to said reading word line.

20. An operating method of a magnetic random access memory, said magnetic random access memory includes:
   first and second bit lines configured to be provided to extend in a first direction,
   a magnetroresistive element configure to store data, and
   a reading circuit,
   wherein said reading circuit includes a first terminal and a second terminal,
   wherein said second terminal has a high impedance that prevents a steady-state current from flowing into at a time of a reading operation,
said operating method comprising:
   supplying a reading current from said first terminal through said first bit line to said magnetroresistive element by said reading circuit;
   electrically connecting one end of said magnetroresistive element to said second bit line; and
   controlling said reading current on the basis of a voltage applied to said second terminal through said second bit line by said reading circuit.

* * * * *